US007262652B2

(12) United States Patent

Omori et al.

(10) Patent No.: US 7,262,652 B2

(45) Date of Patent: Aug. 28, 2007

(54) CURRENT DRIVER, DATA DRIVER, AND DISPLAY DEVICE

(75) Inventors: Tetsuro Omori, Osaka (JP); Hiroshi Kojima, Shiga (JP); Makoto Mizuki, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 114 days.

(21) Appl. No.: 11/302,338

(22) Filed: Dec. 14, 2005

(65) Prior Publication Data

US 2006/0132180 A1 Jun. 22, 2006

(30) Foreign Application Priority Data

Dec. 21, 2004 (JP) ............................ 2004-368740

(51) Int. Cl.
*G05F 1/00* (2006.01)

(52) U.S. Cl. ...................... 327/538; 327/543; 327/108

(58) Field of Classification Search ................ 327/538, 327/543

See application file for complete search history.

(56) References Cited

U.S. PATENT DOCUMENTS

| | | | | |
|---|---|---|---|---|
| 6,057,727 | A * | 5/2000 | Dautriche et al. | 327/543 |
| 6,377,114 | B1 * | 4/2002 | Sakurai | 327/543 |
| 6,476,642 | B1 * | 11/2002 | Morano | 326/86 |
| 6,501,449 | B1 | 12/2002 | Huang | 345/82 |
| 6,646,482 | B2 * | 11/2003 | Takeuchi | 327/112 |
| 6,774,572 | B2 | 8/2004 | Fukuzako | 315/169.1 |
| 6,924,601 | B2 | 8/2005 | Date | 315/469.3 |
| 6,958,742 | B2 * | 10/2005 | Date et al. | 345/90 |
| 7,145,379 | B2 * | 12/2006 | Date et al. | 327/431 |
| 2002/0196212 | A1 | 12/2002 | Nishitoba et al. | 345/76 |
| 2004/0178742 | A1 | 9/2004 | Date et al. | 315/169.3 |
| 2004/0227499 | A1 | 11/2004 | Date et al. | 323/315 |
| 2005/0104819 | A1 | 5/2005 | Shimoda | 345/76 |

FOREIGN PATENT DOCUMENTS

| | | |
|---|---|---|
| JP | 2003-131617 | 5/2003 |
| JP | 2004-198770 | 7/2004 |

* cited by examiner

*Primary Examiner*—Kenneth B. Wells
*Assistant Examiner*—Hai L. Nguyen
(74) *Attorney, Agent, or Firm*—McDermott Will & Emery LLP

(57) ABSTRACT

In a current driver, a gate of a first generating transistor, gates of K driving transistors, and a gate of a second generating transistor are connected to a gate line in this order. A first differential amplifier outputs a voltage determined according to the difference between a voltage from a first supply node and a voltage at the drain of the first generating transistor. A second differential amplifier outputs a voltage determined according to the difference between a voltage from a second supply node and a voltage at the drain of the second generating transistor. The gate of the first generating transistor receives the output of the first differential amplifier. The gate of the second generating transistor receives the output of the second differential amplifier.

24 Claims, 11 Drawing Sheets

CURRENT DRIVER, DATA DRIVER, AND DISPLAY DEVICE

CROSS-REFERENCE TO RELATED APPLICATION

This application claims priority under 35 U.S.C. §119(a) on Japanese Patent Application No. 2004-368740 filed on Dec. 21, 2004, the entire contents of which are hereby incorporated by reference.

BACKGROUND OF THE INVENTION

1. Field of the Invention

The present invention relates to a current driver and specifically to a current driver used as a display driver for an organic EL (Electro Luminescence) panel, or the like.

2. Description of the Prior Art

<Structure of Conventional Current Driver>

FIG. 11 shows a general structure of a conventional current driver 20. The conventional current driver 20 is referenced to reference current Iref as an input from the outside (e.g., from a current supply). The conventional current driver 20 includes a setting reference transistor T201L, supply reference transistors T201RA and T201RB, transistors T202L, T202RA and T202RB for cascode connection (hereinafter, "cascode connection transistor(s)"), bias voltage generating transistors T204A and T204B, and K driving transistors T205-1 to T205-K (K is a natural number).

The setting reference transistor T201L is connected between a power supply node and the cascode connection transistor T202L, and the gate and drain of the setting reference transistor T201L are connected to each other. The cascode connection transistor T202L is connected between the setting reference transistor T201L and an input/output terminal N201, and the gate and drain of the cascode connection transistor T202L are connected to each other.

The supply reference transistor T201RA is connected between the power supply node and the cascode connection transistor T202RA, and the gate of the supply reference transistor T201RA is connected to the gate of the setting reference transistor T201L. The cascode connection transistor T202RA is connected between the supply reference transistor T201RA and a bias voltage generation transistor T204A, and the gate of the cascode connection transistor T202RA is connected to the gate of the cascode connection transistor T202L. The bias voltage generation transistor T204A is connected between the cascode connection transistor T202RA and a ground node, and the gate and drain of the bias voltage generation transistor T204A are connected to each other.

The supply reference transistor T201RB is connected between the power supply node and the cascode connection transistor T202RB, and the gate of the supply reference transistor T201RB is connected to the gate of the setting reference transistor T201L. The cascode connection transistor T202RB is connected between the supply reference transistor T201RB and the bias voltage generating transistor T204B, and the gate of the cascode connection transistor T202RB is connected to the gate of the cascode connection transistor T202L. The bias voltage generating transistor T204B is connected between the cascode connection transistor T202RB and the ground node, and the gate and drain of the bias voltage generating transistor T204B are connected to each other.

The gate of the bias voltage generation transistor T204A and the gate of the bias voltage generating transistor T204B are connected to a bias voltage line G204. The bias voltage line G204 has a resistance value per unit length, which is represented as "wire resistance R".

Each of the driving transistors T205-1 to T205-K is connected between an output node OUT, from which output current Iout is output, and the ground node. The gate of each of the driving transistors T205-1 to T205-K is connected to a bias voltage line G204 at an arbitrary position. The driving transistors T205-1 to T205-K are continuously placed such that the driving transistor T205-1 and the driving transistor T205-K are physically most distant from each other. The driving transistor T205-1 and the bias voltage generation transistor T204A are placed in the vicinity of each other. The driving transistor T205-K and the bias voltage generation transistor T204B are placed in the vicinity of each other.

The setting reference transistor T201L, the supply reference transistors T201RA and T201RB, the cascode connection transistors T202L, T202RA and T202RB, the bias voltage generating transistors T204A and T204B, and the driving transistors T205-1 to T205-K are each formed by one or more transistors.

<Conventional Operation>

Next, an operation of the current driver 20 shown in FIG. 11 is described.

First, a current mirror which is formed by the setting reference transistor T201L, the supply reference transistors T201RA and T201RB, and the bias voltage generating transistors T204A and T204B generates bias voltage VbiasA at the gate of the bias voltage generation transistor T204A and bias voltage VbiasB at the gate of the bias voltage generation transistor T204B. Bias voltage VbiasA has a voltage value determined according to the current value of reference current Iref and the transistor characteristic of the bias voltage generation transistor T204A (the relationship between the voltage value of the gate voltage applied at the gate and the current value of the drain current). Bias voltage VbiasB has a voltage value determined according to the current value of reference current Iref and the transistor characteristic of the bias voltage generation transistor T204B.

<Relationship Between Gate Line G204 and Driving Transistors>

The driving transistor T205-1 and the driving transistor T205-K are physically distant from each other and have different transistor characteristics. Therefore, in some cases, the driving transistor T205-1 and the driving transistor T205-K need to have different gate voltages in order to allow currents of the same magnitude to flow therethrough. In general, the transistor characteristics of the driving transistors T205-1 to T205-K linearly vary over the gate line G204.

When the bias voltage generation transistor T204A is placed in the vicinity of the driving transistor T205-1 and the bias voltage generation transistor T204B is placed in the vicinity of the driving transistor T205-K, the transistor characteristics of the transistors become closer. With such an arrangement, bias voltage VbiasA which has a voltage value suitable to the characteristic of the driving transistor T205-1 and bias voltage VbiasB which has a voltage value suitable to the characteristic of the driving transistor T205-K can be generated.

The gate line G204, which has wire resistance R, has a potential obtained by linear interpolation between bias voltage VbiasA and bias voltage VbiasB applied at the both ends of the gate line G204. Thus, output current Iout, which has a current value determined according to the linearly-interpolated potential of the gate line G204, flows through each of the driving transistors T205-1 to T205-K connected to the gate line G204. Therefore, the variation in the transistor characteristic of the driving transistors T205-1 to T205-K and the linearly-changing potential of the gate line are canceled. Thus, output currents Iout flowing through the driving transistors T205-1 to T205-K have the same current value.

However, in the conventional current driver, the gate and drain of the bias voltage generation transistor T204A are connected to each other, and the gate and drain of the bias voltage generation transistor T204B are connected to each other. The gate of the bias voltage generation transistor T204A and the gate of the bias voltage generation transistor T204B are connected by the bias voltage line which has wire resistance R. Therefore, if the voltage value of bias voltage VbiasA and the voltage value of bias voltage VbiasB are different, current ΔIdr which is determined according to the voltage difference flows through the gate line G204. Thus, for example, if the voltage value of bias voltage VbiasA is smaller than the voltage value of bias voltage VbiasB, the current flowing through the bias voltage generation transistor T204B is drain current Idrs flowing from the setting reference transistor T201RB minus current ΔIdr flowing through the gate line G204 (Idrs−ΔIdr), and the current flowing through the bias voltage generation transistor T204A is drain current Idrs from the setting reference transistor T201RA plus current ΔIdr flowing through the gate line G204 (Idrs+ΔIdr). Thus, due to an error generated between the current flowing through the bias voltage generation transistor T204A and the current flowing through the bias voltage generation transistor T204B, there is a possibility that the voltage values of bias voltages VbiasA and VbiasB cannot be set at appropriate values.

In this case, although current ΔIdr flowing through the gate line G204 is decreased by increasing wire resistance R of the gate line G204, the influence of capacitance coupling of the driving transistors T205-1 to T205-K increases.

SUMMARY OF THE INVENTION

According to an aspect of the present invention, a current driver comprises a first input/output section, a first bias voltage generating transistor, a second input/output section, a second bias voltage generating transistor, K driving transistors (K is a natural number), a first gate line, a first voltage supply node, a first differential amplifier circuit, a second voltage supply node, and a second differential amplifier circuit. A first current is input or output through the first input/output section. The first bias voltage generating transistor is connected between the first input/output section and a first reference node. A second current is input or output through the second input/output section. The second bias voltage generating transistor is connected between the second input/output section and the first reference node. The K driving transistors are connected between an output node through which an output current is input or output and the first reference node. A gate of the first bias voltage generating transistor, gates of the K driving transistors, and a gate of the second bias voltage generating transistor are connected to the first gate line in this order. The first voltage supply node receives a first voltage. The first differential amplifier circuit outputs a third voltage having a voltage value determined according to a difference between a voltage value of a second voltage at a first interconnection node of the first input/output section and the first bias voltage generating transistor and the first voltage value of the first voltage received by the first voltage supply node. The second voltage supply node receives a fourth voltage having a fourth voltage value. The second differential amplifier circuit outputs a sixth voltage having a voltage value determined according to a difference between a voltage value of a fifth voltage at a second interconnection node of the second input/output section and the second bias voltage generating transistor and the fourth voltage value of the fourth voltage received by the second voltage supply node. The first bias voltage generating transistor receives at its gate the third voltage output by the first differential amplifier circuit. The second bias voltage generating transistor receives at its gate the sixth voltage output by the second differential amplifier circuit.

In the above-described current driver, the potential of the first gate line has a value obtained by linear interpolation between the third voltage applied to the gate of the first bias voltage generating transistor and the sixth voltage applied to the gate of the second bias voltage generating transistor. Thus, each of the K driving transistors receives at its gate the bias voltage which has a voltage value determined according to the distance from the first bias voltage generating transistor (or second bias voltage generating transistor). Since the first differential amplifier circuit is connected between the gate and drain of the first bias voltage generating transistor and the second differential amplifier circuit is connected between the gate and drain of the second bias voltage generating transistor, none of the drain current flowing through the first bias voltage generating transistor and the drain current flowing through the second bias voltage generating transistor flows into the first gate line. Therefore, the gradient of the potential of the first gate line and the variation of the transistor characteristic of the K driving transistors (the relationship between the voltage value of the voltage received at the gate and the current value of the drain current flowing through the transistor) are canceled, whereby output currents Iout flowing through the K driving transistors have the same current value.

Since the first and second differential amplifier circuits have low output impedance, the voltage drop is small in the first and second differential amplifier circuits. Therefore, the power is efficiently used as compared with the conventional current driver. Since the first and second differential amplifier circuits have high input impedance, electrical load imposed on the circuits immediately preceding to the first and second differential amplifier circuits (e.g., the first and second input/output sections) is small. A change in the potential of the first gate line which can be caused due to the influence of capacitance coupling of transistors is removed by a negative feedback circuit which is formed by the first differential amplifier circuit (second differential amplifier circuit) and the first bias voltage generating transistor (second bias voltage generating transistor).

Preferably, the first gate line has a first node and a second node. The gate of the first bias voltage generating transistor is connected to the first node of the first gate line. The gate of the second bias voltage generating transistor is connected to the second node of the first gate line. The gate of each of the K transistors is connected between the first node and the second node of the first gate line.

Preferably, the current driver further comprises a setting transistor. The setting transistor is connected between a second reference node and an input/output node through which a reference current is input or output, a gate and drain of the setting transistor being connected to each other. The first input/output section includes a first supply transistor. The first supply transistor is connected between the second reference node and the first interconnection node, a gate of the first supply transistor being connected to the gate of the setting transistor. The second input/output section includes a second supply transistor. The second supply transistor is connected between the second reference node and the second interconnection node, a gate of the second supply transistor being connected to the gate of the setting transistor.

In the above-described current driver, a drain current which has a current value determined according to the current value of the reference current flows through the first bias generating transistor and second first bias generating transistor. Therefore, bias voltages which have current values determined according to the current value of the reference current are generated. An output current which has a current value determined according to the current value of the reference current flows through each of the K driving transistors.

Preferably, the setting transistor and the first and second supply transistors are cascode-connected.

In the above-described current driver, the drain voltages of the setting transistor and the first and second supply transistors have the same voltage value. With this feature, the drain current which has a current value determined according to the current value of the reference current flows through the first and second bias voltage generating transistors with no influence of the drain voltage dependence.

Preferably, the current driver further comprises a third input/output section, a third bias voltage generating transistor, a third voltage supply node, and a third differential amplifier circuit. A third current is input or output through the third input/output section. The third bias voltage generating transistor is connected between the third input/output section and the first reference node. The third voltage supply node receives a seventh voltage. The third differential amplifier circuit outputs a ninth voltage having a voltage value determined according to a difference between a voltage value of an eighth voltage at a third interconnection node of the third input/output section and the third bias voltage generating transistor and the seventh voltage value of the seventh voltage received by the third voltage supply node. The gate of the first bias voltage generating transistor, gates of first to Hth of the driving transistors, a gate of the third bias voltage generating transistor, gates of (H+1)th to Kth of the driving transistors, and a gate of the second bias voltage generating transistor are connected to the first gate line in this order, where H is a natural number satisfying $1 \leqq H \leqq K-1$. The third bias voltage generating transistor receives at its gate the ninth voltage output by the third differential amplifier circuit.

In the above-described current driver, applied to the first gate line are not two voltages (third voltage and sixth voltage) but three voltages (third voltage, sixth voltage, and ninth voltage). Therefore, the potential of the first gate line is set to a potential which is determined according to the variation of the transistor characteristic among the K driving transistors. With this feature, output currents flowing through the K driving transistors are controlled to have the same current value with high accuracy.

Preferably, the first gate line further includes a first node, a second node, and a third node. The third node exists between the first node and the second node. The gate of the third bias voltage generating transistor is connected to the third node of the first gate line. Among the K driving transistors, the gates of the first to Hth driving transistors (H driving transistors) are connected to the first gate line between the first node and the third node (H is a natural number). The gates of the (H+1)th to Kth driving transistors (K-H driving transistors) are connected to the first gate line between the third node and the second node.

Preferably, the current driver further comprises K output voltage limiting transistors and a second gate line. The K output voltage limiting transistors are connected between the K driving transistors and the output node. Gates of the K output voltage limiting transistors are connected to the second gate line. The second gate line receives a limited voltage which has a predetermined voltage value.

In the above-described current driver, the drain voltages of the K driving transistors have the same voltage value. With this feature, the influence of the drain voltage dependence is decreased, and output currents flowing through the K driving transistors are controlled to have the same current value with high accuracy.

Preferably, the current driver further comprises a first voltage limiting transistor and a second voltage limiting transistor. The first voltage limiting transistor is connected between the first interconnection node and the first bias voltage generating transistor. The second voltage limiting transistor is connected between the second interconnection node and the second bias voltage generating transistor. A gate of the first voltage limiting transistor, the gates of the K output voltage limiting transistors, and a gate of the second voltage limiting transistor are connected to the second gate line in this order.

In the above-described current driver, the drain voltages of the first bias voltage generating transistor, the K driving transistors, and the second bias voltage generating transistor have the same voltage value. With this feature, the influence of the drain voltage dependence is decreased, and output currents flowing through the K driving transistors are controlled to have the same current value with high accuracy.

Preferably, the second gate line further includes a third node and a fourth node. The gate of the first voltage limiting transistor is connected to the third node of the second gate line. The gate of the second voltage limiting transistor is connected to the fourth node of the second gate line. The gate of each of the K output voltage limiting transistors is connected to the second gate line between the third node and the fourth node.

Preferably, the current driver further comprises a third input/output section and first and second cascode transistors. A third current is input or output through a third input/output section. The first and second cascode transistors are connected in series between the third input/output section and the first reference node. The first cascode transistor is connected between the third input/output section and the second cascode transistor, a gate and drain of the first cascode transistor being connected to each other. The second cascode transistor is connected between the first cascode transistor and the first reference node, a gate and drain of the second cascode transistor being connected to each other. The second gate line receives a first gate voltage generated at the gate of the first cascode transistor.

In the above-described current driver, the same voltage (the first gate voltage generated at the gate of the first cascode transistor) is applied to the gates of the first bias voltage generating transistor, the K driving transistors, and the second bias voltage generating transistor. With this feature, the influence of the drain voltage dependence is decreased, and output currents flowing through the K driving transistors are controlled to have the same current value with high accuracy.

Preferably, the first and second voltage supply nodes receive the first gate voltage generated at the gate of the first cascode transistor.

In the above-described current driver, it is not necessary to separately generate the first voltage and the second voltage. Therefore, a voltage generating circuit(s) for generating the first and second voltages is unnecessary, so that the circuit scale is decreased.

Preferably, the current driver further comprises a voltage follower circuit. The second gate line receives an output of the voltage follower circuit.

In the above-described current driver, the voltage follower circuit has low output impedance. Therefore, a change in the potential of the second gate line due to capacitance coupling is decreased.

Preferably, the second gate line has a third node and a fourth node. The gates of the K output voltage limiting transistors are connected to the second gate line between the third node and the fourth node. The second gate line receives the output of the voltage follower circuit at any one of the third and fourth nodes.

Preferably, the current driver further comprises a first voltage limiting transistor, a third input/output section, and first and second cascode transistors. The first voltage limiting transistor is connected between the first interconnection node and the first bias voltage generating transistor. A third current is input or output through the third input/output section. The first and second cascode transistors are connected in series between the third input/output section and the first reference node. The first cascode transistor is connected between the third input/output section and the second cascode transistor, a gate and drain of the first cascode transistor being connected to each other. The second cascode transistor is connected between the first cascode transistor and the first reference node, a gate and drain of the second cascode transistor being connected to each other. The gate of the first voltage limiting transistor and the voltage follower circuit receive a first gate voltage generated at the gate of the first cascode transistor.

Preferably, the current driver further comprises a second voltage limiting transistor, a fourth input/output section, and third and fourth cascode transistors. The second voltage limiting transistor is connected between the second interconnection node and the second bias voltage generating transistor. A fourth current is input or output through the fourth input/output section. The third and fourth cascode transistors are connected in series between the fourth input/output section and the first reference node. The third cascode transistor is connected between the fourth input/output section and the fourth cascode transistor, a gate and drain of the third cascode transistor are connected to each other. The fourth cascode transistor is connected between the third cascode transistor and the first reference node, a gate and drain of the fourth cascode transistor are connected to each other. The second voltage limiting transistor receives at its gate a second gate voltage generated at the gate of the third cascode transistor.

Preferably, the first voltage supply node receives the first gate voltage generated at the gate of the first cascode transistor. The second voltage supply node receives the second gate voltage generated at the gate of the third cascode transistor.

Preferably, the current driver further comprises K switch transistors, K control sections, and a second gate line. The K switch transistors are connected between the K driving transistors and the output node. The K control sections correspond to the K switch transistors on a one-to-one basis. The second gate line receives a limited voltage having a predetermined voltage value. Each of the K control sections has a first mode and a second mode and includes a first terminal connected to the second gate line and a second terminal connected to the first reference node. In the first mode, a voltage at the first terminal is supplied to a gate of a switch transistor corresponding to the control section. In the second mode, a voltage at the second terminal is supplied to a gate of a switch transistor corresponding to the control section.

In the above-described current driver, the structure for setting the drain voltages of the K driving transistors and the structure for generating a driving current which has an arbitrary gray level share overlapping components. Therefore, the circuit scale of the current driver is decreased.

Preferably, the first supply transistor is formed by P current-voltage conversion transistors, where P is a natural number. The P current-voltage conversion transistors are connected in parallel between the second reference node and the first interconnection node. Each of the P current-voltage conversion transistors receives at its gate a gate voltage generated at the gate of the setting transistor.

In the above-described current driver, the influence of the variation in the transistor characteristic of the first supply transistor is decreased.

Preferably, the above-described current driver further comprises a control section and a connection section. The control section selects N current-voltage conversion transistors from among the P current-voltage conversion transistors, where N is a natural number satisfying N≦P. The connection section connects each of the N current-voltage conversion transistors selected by the control section to the first interconnection node.

In the above-described current driver, the number of current-voltage conversion transistors which are to receive the gate voltage generated at the gate of the supply transistor. With this feature, the drain current flowing through the first bias voltage generating transistor is controlled to have an optimum current value.

Preferably, the setting transistor is formed by P current-voltage conversion transistors, where P is a natural number. The P current-voltage conversion transistors are connected in parallel between the second reference node and the input/output node. Each of the P current-voltage conversion transistors has a gate and a drain connected to each other. Each of the first and second supply transistors receives, at its gate, gate voltages generated at the P current-voltage conversion transistors.

In the above-described current driver, the influence of the variation in the transistor characteristic of the supply transistor is decreased.

Preferably, the above-described current driver further comprises a control section and a connection section. The control section selects N current-voltage conversion transistors from among the P current-voltage conversion transistors, where N is a natural number satisfying N≦P. The connection section connects a gate and a drain to each other in each of the N current-voltage conversion transistors selected by the control section. Each of the first and second supply transistors receives, at its gate, gate voltages generated at gates of the N current-voltage conversion transistors in which the gate and the drain are connected by the connection section.

In the above-described current driver, the number of current-voltage conversion transistors which are to generate a gate voltage applied to the gates of the first and second supply transistors is selected. With this feature, the drain currents flowing through the first and second bias voltage generating transistors are controlled to have optimum current values.

Preferably, the above-described current driver further comprises a storage section. The storage section stores information indicative of the number of transistors which are to be selected by the control section from among the P current-voltage conversion transistors. The control section selects N current-voltage conversion transistors from among the P current-voltage conversion transistors according to the information stored in the storage section.

In the above-described current driver, the drain currents flowing through the first and/or second bias voltage generating transistors are maintained to have optimum current values so long as the number of current-voltage conversion transistors which causes the drain currents flowing through the first and/or second bias voltage generating transistors to have optimum current values is stored in the storage section.

Preferably, the storage section includes a plurality of fuses. The control section has a condition-fixed mode and an emulation mode. When the control section operates in the condition-fixed mode, the control section selects the N current-voltage conversion transistors from among the P current-voltage conversion transistors according to the states of the plurality of fuses. When the control section operates in the emulation mode, the control section emulates the states of the plurality of fuses to select the N current-voltage conversion transistors from among the P current-voltage conversion transistors.

Preferably, each of the setting transistor, the first supply transistor, and the second supply transistor is formed by a plurality of transistors. The plurality of transistors which form the setting transistor, the plurality of transistors which form the first supply transistor, and the plurality of transistors which form the second supply transistor are uniformly distributed over one chip.

In the above-described current driver, the influence of the variation in the transistor characteristic among the setting transistor, the first supply transistor, and the second supply transistor is decreased.

According to another aspect of the present invention, a data driver comprises the above-described current driver, a selection section, and a driving current output terminal. The selection section selects X output currents according to externally-input representation data from among K output currents output by the current driver, where X is a natural number satisfying X≦K. A total of the X output currents selected by the selection section is output from the driving current output terminal as a driving current. The representation data represents a gray level.

In the above-described data driver, the current driver outputs output currents which have the same current value. Thus, the selection section generates a driving current which has a current value determined according to the gray level represented by the representation data with high accuracy.

According to still another aspect of the present invention, a display device comprises the above-described data driver and a display panel. The display panel is driven by a driving current output from the data driver.

In the above-described display device, the data driver outputs a driving current which has a current value determined according to the gray level represented by the representation data. Thus, the display panel is driven with high accuracy.

DESCRIPTION OF THE PREFERRED EMBODIMENTS

Figure 1:
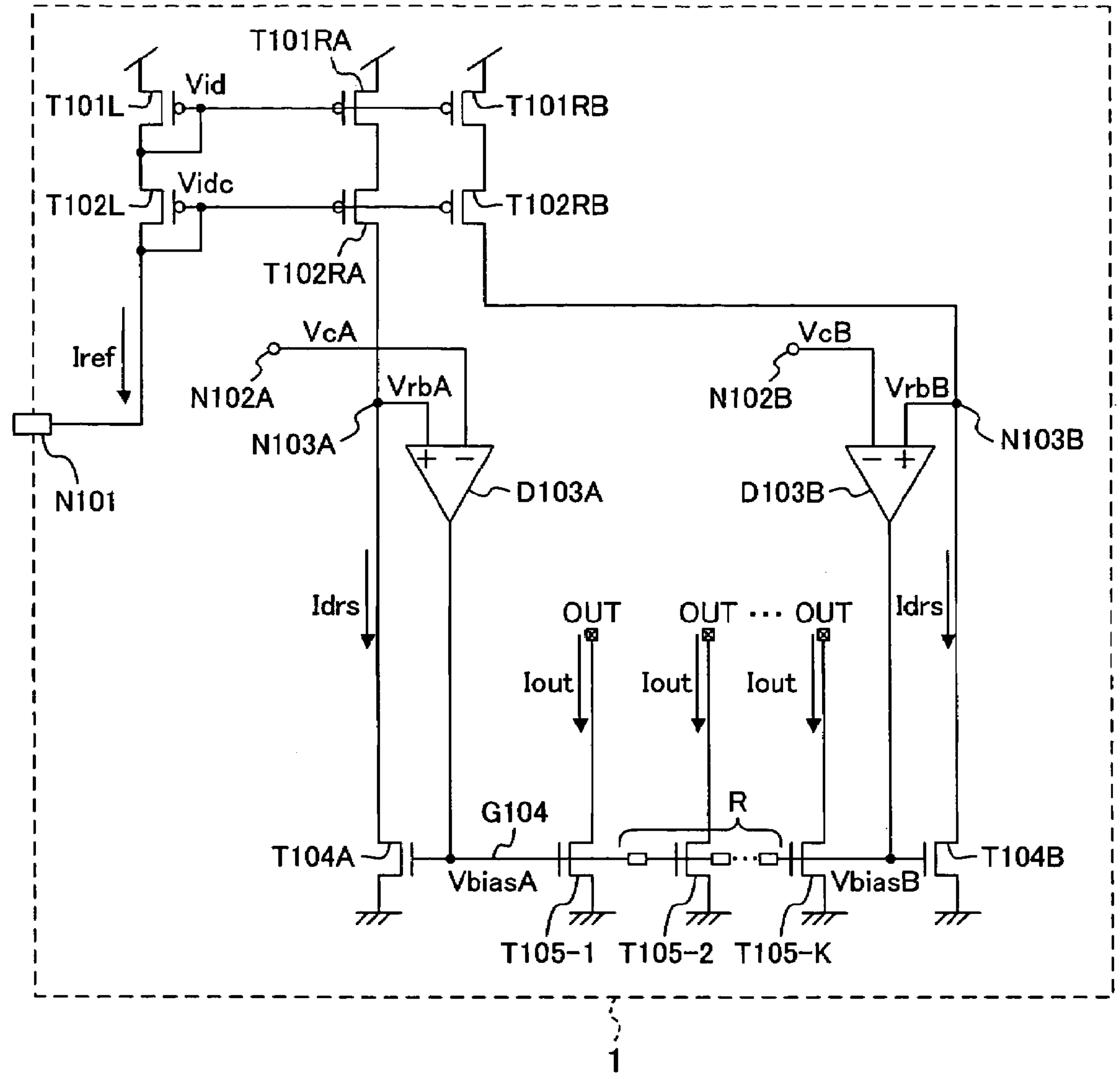
FIG. 1 shows the general structure of a current driver 1 according to embodiment 1 of the present invention.

Hereinafter, embodiments of the present invention will be described in detail with reference to the drawings. It should be noted that, throughout the drawings, the same or equivalent elements are denoted by the same reference numerals, and the descriptions thereof are not repeated.

Embodiment 1

<General Structure>

FIG. 1 shows the general structure of a current driver 1 according to embodiment 1 of the present invention. The current driver 1 includes a setting reference transistor T101L, supply reference transistors T101RA and T101RB, transistors T102L, T102RA and T102RB for cascode connection (hereinafter, "cascode connection transistor(s)"), reference current supply nodes N102A and N102B, differential amplifier circuits D103A and D103B, bias voltage generating transistors T104A and T104B, and K driving transistors T105-1 to T105-K (K is a natural number). The current driver 1 receives reference current Iref at a reference current input node N101. The current driver 1 is capable of allowing drain current Idrs, which has a current value equal or proportional to the current value of input reference current Iref, to flow through the bias voltage generating transistors T104A and T104B. The current driver 1 outputs output current Iout, which has a current value equal or proportional to the current value of drain current Idrs, to a plurality of display element circuits (not shown).

The setting reference transistor T101L and the cascode connection transistor T102L are connected in series between the power supply node and the reference current input node N101. The gate of the setting reference transistor T101L is connected to the gate of the supply reference transistor T101RA and the gate of the supply reference transistor T101RB. The gate of the cascode connection transistor T102L is connected to the gate of the cascode connection transistor T102RA and the gate of the cascode connection transistor T102RB.

The supply reference transistor T101RA, the cascode connection transistor T102RA and the bias voltage generating transistor T104A are connected in series between the power supply node and the ground node. The gate of the bias voltage generating transistor T104A is connected to a gate line G104. The differential amplifier circuit D103A has a non-inverting input terminal connected to a node N103A which exists between the cascode connection transistor T102RA and the bias voltage generating transistor T104A, an inverting input terminal connected to the reference voltage supply node N102A, and an output terminal connected to the gate line G104.

The supply reference transistor T101RB, the cascode connection transistor T102RB and the bias voltage generating transistor T104B are connected in series between the power supply node and the ground node. The gate of the bias voltage generating transistor T104B is connected to the gate line G104. The differential amplifier circuit D103B has a non-inverting input terminal connected to a node N103B which exists between the cascode connection transistor T102RB and the bias voltage generating transistor T104B, an inverting input terminal connected to the reference voltage supply node N102B, and an output terminal connected to the gate line G104.

Each of the driving transistors T105-1 to T105-K is connected to output node OUT and the ground node. The driving transistors T105-1 to T105-K are connected in series between the bias voltage generating transistor T104A and the bias voltage generating transistor T104B. The gates of the driving transistors T105-1 to T105-K are connected to the gate line G104 in this order. Thus, in each of the driving transistors T105-1 to T105-K, output current Iout which has a current value determined according to the voltage value of a voltage applied to the gate of the transistor (potential at a connection point of the gate and the gate line G104) flows.

It should be noted herein that the driving transistors T105-1 to T105-K are assumed to be placed in the vicinity of one another (for example, the driving transistors T105-1 to T105-K are assumed to be continuously formed on one chip).

It should also be noted herein that all the transistors operate in a saturation region.

Herein, it is assumed that the supply reference transistors T101RA and T101RB exhibit the same or substantially the same transistor characteristic (herein, the relationship between the voltage value of a voltage applied to the gate of the transistor and the current value of the drain current flowing through the transistor) as that of the setting reference transistor T101L.

It is also assumed that the cascode connection transistors T102RA and T102RB exhibit the same or substantially the same transistor characteristic as that of the cascode connection transistor T102L. Thus, the performance ratio between the cascode connection transistor T102L and the cascode connection transistor T102RA is equal to the performance ratio between the setting reference transistor T101L and the supply reference transistor T101RA. The performance ratio between the cascode connection transistor T102L and the cascode connection transistor T102RB is equal to the performance ratio between the setting reference transistor T101L and the supply reference transistor T101RB.

It is also assumed that the bias voltage generating transistor T104A exhibits the same or substantially the same transistor characteristic as that of the driving transistor T105-1. It is also assumed that the bias voltage generating transistor T104B exhibits the same or substantially the same transistor characteristic as that of the driving transistor T105-K.

<Current Mirror Structure>

The setting reference transistor T101L and the supply reference transistors T101RA and T101RB constitute a current mirror circuit. The gate and drain of the setting reference transistor T101L are connected to each other. At the gate of the setting reference transistor T101L, gate voltage Vid which has a voltage value determined according to the current value of reference current Iref is generated. The supply reference transistor T101RA receives, at the gate, gate voltage Vid generated at the gate of the setting reference transistor T101L. Thus, drain current Idrs which has a current value determined according to the voltage value of gate voltage Vid flows through the supply reference transistor T101RA.

As does the supply reference transistor T101RA, the supply reference transistor T101RB receives gate voltage Vid at the gate, and drain current Idrs which has a current value determined according to the voltage value of gate voltage Vid flows through the supply reference transistor T101RB.

Thus, the current mirror circuit generates drain current Idrs which has a current value determined according to the current value of reference current Iref and the performance ratio between the setting reference transistor T101L and the supply reference transistors T101RA and T101RB.

<Cascode Connection>

The gate and drain of the cascode connection transistor T102L are connected to each other. At the gate of the cascode connection transistor T102L, gate voltage Vidc which has a voltage value determined according to the current value of reference current Iref is generated. Gate voltage Vidc generated at the gate of the cascode connection transistor T102L is received by each of the cascode connection transistors T102RA and T102RB at the gate.

Since the supply reference transistor T101RA is cascode-connected to the setting reference transistor T101L, the voltage value of the drain voltage of the supply reference transistor T101RA is equal to the voltage value of the drain voltage of the setting reference transistor T101L.

Since the supply reference transistor T101RB is cascode-connected to the setting reference transistor T101L as is the supply reference transistor T101RA, the voltage value of the drain voltage of the supply reference transistor T101RB is equal to the voltage value of the drain voltage of the setting reference transistor T101L.

Thus, the influence of the drain voltage dependence is reduced by the cascode connection, and an error of the voltage value of drain current Idrs with respect to the current value of reference current Iref can be reduced.

<Characteristics of Transistors Formed on One Chip>

In general, a plurality of transistors formed on one chip have a linearly changing relationship between the voltage values of the gate voltages received at the gates of transistors and the current values of the drain currents flowing through the transistors (transistor characteristic). For example, among a plurality of transistors formed continuously in series, the threshold voltage of the transistors gradually increases (or decreases) when measured from the one at the leading end to the one at the trailing end. Therefore, when gate voltages having the same voltage value are applied to the gates of the plurality of transistors, the current values of the drain currents flowing through the respective transistors (herein, the current values of output currents Iout flowing through the driving transistors T105-1 to T105-K) linearly vary.

<Potential of Gate Line G104>

The voltage value of bias voltage VbiasA generated at the gate of the bias voltage generating transistor T104A is set to a voltage value determined according to the transistor characteristic of the bias voltage generating transistor T104A and the current value of drain current Idrs. The driving transistor T105-1 has the same transistor characteristic as that of the bias voltage generating transistor T104A, and therefore, output current Iout, which has a current value equal to that of drain current Idrs flowing through the bias voltage generating transistor T104A, flows through the driving transistor T105-1.

The voltage value of bias voltage VbiasB generated at the gate of the bias voltage generating transistor T104B is set to a voltage value determined according to the transistor characteristic of the bias voltage generating transistor T104B and the current value of drain current Idrs. The driving transistor T105-K has the same transistor characteristic as that of the bias voltage generating transistor T104B, and therefore, output current Iout, which has a current value equal to that of drain current Idrs flowing through the bias voltage generating transistor T104B, flows through the driving transistor T105-K.

Bias voltage VbiasA generated at the gate of the bias voltage generating transistor T104A is received by the gate line G104 at one end. Bias voltage VbiasB generated at the gate of the bias voltage generating transistor T104B is received by the gate line G104 at the other end.

Herein, it is assumed that the transistor characteristic of the driving transistors T105-1 to T105-K gradually increases (the voltage value of the threshold voltage of the driving transistors T105-1 to T105-K gradually decreases) from the driving transistor T105-1 to the driving transistor T105-K. In other words, when measured from the driving transistor T105-1 to the driving transistor T105-K, each driving transistor has a greater transistor characteristic than the immediately preceding driving transistor (each driving transistor has a lower threshold voltage than the immediately preceding driving transistor). In this case, the voltage value of bias voltage VbiasA is smaller than that of bias voltage VbiasB.

Since the resistance value of the gate line G104 is not "0", the gate line G104 has a potential obtained by linear interpolation between the voltage value of bias voltage VbiasA and the voltage value of bias voltage VbiasB received at the ends of the gate line G104. The potential of the gate line G104 linearly increases from the voltage value of bias voltage VbiasA to the voltage value of bias voltage VbiasB when measured in a direction from the driving transistor T105-1 to the driving transistor T105-K.

The gate of each of the driving transistors T105-1 to T105-K is supplied with a bias voltage which has a voltage value determined according to the distance from the bias voltage generating transistor T104A (or the distance from the bias voltage generating transistor T104B).

Thus, the gradient of the potential of the gate line G104 and the variation of the transistor characteristic of the driving transistors T105-1 to T105-K are canceled by each other, whereby output currents Iout output from the driving transistors T105-1 to T105-K have the same current value.

<Negative Feedback Structure>

The differential amplifier circuit D103A and the bias voltage generating transistor T104A constitute a negative feedback circuit. The reference voltage supply node N102A supplies reference voltage VcA. The differential amplifier circuit D103A outputs to the gate line G104 bias voltage VbiasA which has a voltage value determined according to the difference between the voltage value of reference voltage VcA supplied from the reference voltage supply node N102A and the voltage value of drain voltage VrbA generated at the node N103A. The bias voltage generating transistor T104A receives, at the gate, bias voltage VbiasA output by the differential amplifier circuit D103A. Therefore, the resistance value of the channel resistance of the bias voltage generating transistor T104A changes according to a variation in the voltage value of bias voltage VbiasA. With this structure, drain voltage VrbA at the node N103A is controlled to be equal to reference voltage VcA supplied from the reference voltage supply node N102A.

The differential amplifier circuit D103B and the bias voltage generating transistor T104B also constitute a negative feedback circuit as do the differential amplifier circuit D103A and the bias voltage generating transistor T104A. The reference voltage supply node N102B supplies reference voltage VcB. The differential amplifier circuit D103B outputs to the gate line G104 bias voltage VbiasB which has a voltage value determined according to the difference between the voltage value of reference voltage VcB supplied from the reference voltage supply node N102B and the voltage value of drain voltage VrbB generated at the node N103B. The bias voltage generating transistor T104B receives, at the gate, bias voltage VbiasB output by the differential amplifier circuit D103B. Therefore, the resistance value of the channel resistance of the bias voltage generating transistor T104B changes according to a variation in the voltage value of bias voltage VbiasB. With this structure, drain voltage VrbB at the node N103B is controlled to be equal to reference voltage VcB supplied from the reference voltage supply node N102B.

Where the drain voltage of the cascode connection transistor T102RA (T102RB) and the drain voltage of the bias voltage generating transistor T104A (T104B) are the same voltage, for example, reference voltage VcA (VcB) is at a level such that the cascode connection transistor T102RA (T102RB) and the bias voltage generating transistor T104A (T104B) can operate in a saturation region.

<Operation>

Next, the operation of the current driver 1 is described with reference to FIG. 1.

First, reference current Iref input at the reference current input node N101 flows through the setting reference transistor T101L and the cascode connection transistor T102L. Thus, gate voltage Vid is generated at the gate of the setting reference transistor T101L, and gate voltage Vidc is generated at the gate of the cascode connection transistor T102L.

Then, the supply reference transistor T101RA receives gate voltage Vid at the gate, and the cascode connection transistor T102RA receives gate voltage Vidc at the gate. Thus, drain current Idrs, which has a current value determined according to the voltage value of gate voltage Vid, the voltage value of gate voltage Vidc, and the voltage value of bias voltage VbiasA, flows through the supply reference transistor T101RA, the cascode connection transistor T102RA, and the bias voltage generating transistor T104A. Meanwhile, drain voltage VrbA which has a voltage value determined according to the current value of drain current Idrs is generated at the node N103A.

Then, the differential amplifier circuit D103A receives reference voltage VcA supplied from the reference voltage supply node N102A at the inverting input terminal and drain voltage VrbA generated at the node N103A at the non-inverting input terminal and outputs to the gate line G104 bias voltage VbiasA which has a voltage value determined according to the difference between the voltage value of reference voltage VcA and the voltage value of drain voltage VcB.

Then, bias voltage VbiasA output to the gate line G104 is received by the bias voltage generating transistor T104A. Thus, the resistance value of the channel resistance of the bias voltage generating transistor T104A is determined according to the voltage value of bias voltage VbiasA.

The operations performed in the supply reference transistor T101RB, the cascode connection transistor T102RB, the bias voltage generating transistor T104B, the reference voltage supply node N102B and the differential amplifier circuit D103B are the same as those of the supply reference transistor T101RA, the cascode connection transistor T102RA, the bias voltage generating transistor T104A, the reference voltage supply node N102A and the differential amplifier circuit D103A. Thus, drain current Idrs which has a current value determined according to the voltage values of gate voltage Vid, gate voltage Vidc, and bias voltage VbiasB flows through the supply reference transistor T101RB, the cascode connection transistor T102RB, and the bias voltage generating transistor T104B. The differential amplifier circuit D103B outputs to the gate line G104 bias voltage VbiasB which has a voltage value determined according to the difference between the voltage value of reference voltage VcB supplied from the reference voltage supply node N102B and the voltage value of drain voltage VrbB generated at the node N103B. Thus, the resistance value of the channel resistance of bias voltage VbiasB is determined according to the voltage value of bias voltage VbiasB output from the differential amplifier circuit D103B.

Then, the potential of the gate line G104 has a value obtained by linear interpolation between the voltage value of bias voltage VbiasA and the voltage value of bias voltage VbiasB. Thus, in each of the driving transistors T105-1 to T105-K, output current Iout which has a current value determined according to the voltage value of a voltage applied to the gate of the transistor (potential at a connection point of the gate and the gate line G104) flows.

[(Current Value of Drain Current Idrs)<(Current Value of Reference Current Iref)]

A case where the current value of drain current Idrs flowing through the supply reference transistor T101RA is smaller than the current value of reference current Iref flowing through the setting reference transistor T101L is now considered.

In this case, the resistance value of the channel resistance of the bias voltage generating transistor T104A is large in comparison with the case where the current value of drain current Idrs is equal to the current value of reference current Iref. Therefore, the voltage value of drain voltage VrbA generated at the node N103A is higher than the voltage value of reference voltage VcA. Accordingly, the voltage value of bias voltage VbiasA output from the differential amplifier circuit D103A is higher than the voltage value of bias voltage VbiasA which is output when drain voltage VrbA is equal to reference voltage VcA. Thus, the resistance value of the channel resistance of the bias voltage generating transistor T104A becomes small, whereby the current value of drain current Idrs flowing through the supply reference transistor T101RA, the cascode connection transistor T102RA, and the bias voltage generating transistor T104A becomes large. Further, due to the small resistance value of the channel resistance of the bias voltage generating transistor T104A, the voltage value of the drain voltage VrbA generated at the node N103A becomes low.

[(Current Value of Drain Current Idrs)>(Current Value of Reference Current Iref)]

A case where the current value of drain current Idrs flowing through the supply reference transistor T101RA is larger than the current value of reference current Iref flowing through the setting reference transistor T101L is now considered.

In this case, the resistance value of the channel resistance of the bias voltage generating transistor T104A is small in comparison with the case where the current value of drain current Idrs is equal to the current value of reference current Iref. Therefore, the voltage value of drain voltage VrbA generated at the node N103A is lower than the voltage value of reference voltage VcA. Accordingly, the voltage value of bias voltage VbiasA output from the differential amplifier circuit D103A is lower than the voltage value of bias voltage VbiasA which is output when drain voltage VrbA is equal to reference voltage VcA. Thus, the resistance value of the channel resistance of the bias voltage generating transistor T104A becomes large, whereby the current value of drain current Idrs flowing through the supply reference transistor T101RA, the cascode connection transistor T102RA, and the bias voltage generating transistor T104A becomes small. Further, due to the large resistance value of the channel resistance of the bias voltage generating transistor T104A, the voltage value of the drain voltage VrbA generated at the node N103A becomes high.

Although only the control of drain current Idrs flowing through the supply reference transistor T101RA, the cascode connection transistor T102RA, and the bias voltage generating transistor T104A has been described, drain current Idrs flowing through the supply reference transistor T10RB, the cascode connection transistor T102RB, and the bias voltage generating transistor T104B is controlled in the same manner.

<Current Flowing Through Gate Line G104>

The differential amplifier circuit D103A is connected between the gate and drain of the bias voltage generating transistor T104A, and the differential amplifier circuit D103B is connected between the gate and drain of the bias voltage generating transistor T104B. Therefore, none of drain current Idrs flowing through the bias voltage generating transistor T104A and drain current Idrs flowing through the bias voltage generating transistor T104B flows into the gate line G104.

<Effects>

As described above, in the current driver of embodiment 1, output currents Iout flowing through the driving transistors T105-1 to T105-K are controlled to have the same current value without allowing a current to flow through the gate line G104.

Since the differential amplifier circuits D103A and D103B have low output impedance, the voltage drop is small in the differential amplifier circuits D103A and D103B. Therefore, the power is efficiently used as compared with the conventional current driver.

Since the differential amplifier circuits D103A and D103B have high input impedance, electrical load imposed on the setting reference transistor T101L and the supply reference transistors T101RA and T101RB is small.

A change in the potential of the gate line G104 which can be caused due to the influence of capacitance coupling of transistors is removed by a negative feedback circuit which is formed by the differential amplifier circuit D103A (or D103B) and the bias voltage generating transistor T104A (or T104B).

The setting reference transistor T101L and the supply reference transistors T101RA and T101RB are preferably placed in the vicinity of one another. The cascode connection transistors T102L, T102RA, and T102RB are preferably placed in the vicinity of one another. With such a structure, the current value of drain current Idrs flowing through the supply reference transistors T101RA and T101RB becomes closer to the current value of reference current Iref flowing through the setting reference transistor T101L.

The bias voltage generating transistor T104A and the driving transistor T105-1 are preferably placed in the vicinity of each other. With this structure, the current value of output current Iout flowing through the driving transistor T105-1 becomes closer to the current value of drain current Idrs flowing through the bias voltage generating transistor T104A. The bias voltage generating transistor T104B and the driving transistor T105-K are preferably placed in the vicinity of each other. With this structure, the current value of output current Iout flowing through the driving transistor T105-K becomes closer to the current value of drain current Idrs flowing through the bias voltage generating transistor T104B.

Preferably, the voltage value of reference voltages VcA and VcB is substantially equal to the voltage value of the drain voltages of the driving transistors T105-1 to T105-K. With such a structure, the current mirror circuit which is formed by the bias voltage generating transistors T104A and T104B and the driving transistors T105-1 to T105-K duplicatingly generates output current Iout with a reduced influence of the drain voltage dependence (Early effect), i.e., generates output current Iout which has the same current value as that of drain current Idrs.

Embodiment 2

<Characteristics of Transistors Formed on One Chip>

A plurality of transistors formed on one chip can have linearly-changing threshold voltage values. Alternatively, among a plurality of aligned transistors, the transistors provided at the central region have threshold voltage values smaller than those of the transistors at the both ends. In this case, the transistor characteristics of the transistors vary in an inverted “V” shape fashion.

<General Structure>

FIG. 1 shows the general structure of a current driver 2 according to embodiment 2 of the present invention. The current driver 2 includes, in addition to the components of the current driver 1 shown in FIG. 1, a supply reference transistor T101RC, a cascode connection transistor T102RC, a reference voltage supply node N103C, a differential amplifier circuit D103C, and a bias voltage generating transistor T104C. That is, the current driver 2 includes another set of a supply reference transistor, a cascode connection transistor, a reference voltage supply node, a differential amplifier circuit, and a bias voltage generating transistor.

The supply reference transistor T101RC, the cascode connection transistor T102RC, and the bias voltage generating transistor T104C are connected in series between the power supply node and the ground node. The gate of the supply reference transistor T101RC is connected to the gate of the setting reference transistor T101L. The gate of the cascode connection transistor T102RC is connected to the gate of the cascode connection transistor T102L. The differential amplifier circuit D103C has a non-inverting input terminal connected to the node N103C which exists between the cascode connection transistor T102RC and the bias voltage generating transistor T104C, an inverting input terminal connected to a reference voltage supply node N102C, and an output terminal connected to the gate line G104. The bias voltage generating transistor T104C is connected between a driving transistor T105-(H) and a driving transistor T105-(H+1) (H is a natural number which satisfies $1 \leqq H \leqq K-1$). The gate of the bias voltage generating transistor T104C is connected to the gate line G104.

It is assumed that the supply reference transistor T101RC exhibits the same or substantially the same transistor characteristic as that of the setting reference transistor T101L. It is assumed that the cascode connection transistor T102RC exhibits the same or substantially the same transistor characteristic as that of the cascode connection transistor T102L. It is assumed that the bias voltage generating 10 transistor T104C exhibits the same or substantially the same transistor characteristic as that of the driving transistor T105-(H) and/or the driving transistor T105-(H+1). It is assumed that the supply reference transistor T101RC, the cascode connection transistor T102RC, and the bias voltage generating transistor T104C operate in a saturation region.

<Current Mirror Structure>

The setting reference transistor T101L and the supply reference transistor T101RC constitute a current mirror circuit. The supply reference transistor T101RC receives, at the gate, gate voltage Vid generated at the gate of the setting reference transistor T101L as the supply reference transistor T101RA does. Thus, drain current Idrs which has a current value determined according to the voltage value of gate voltage Vid flows through the supply reference transistor T101RC.

<Cascode Connection>

The cascode connection transistor T102RC receives, at the gate, gate voltage Vidc generated at the gate of the setting reference transistor T101L as does the supply reference transistor T102RA. Since the supply reference transistor T101RC is cascode-connected to the setting reference transistor T101L, the voltage value of the drain voltage of the supply reference transistor T101RC is equal to the voltage value of the drain voltage of the setting reference transistor T101L.

<Negative Feedback Circuit>

The reference voltage supply node N102C supplies reference voltage VcC. As does the differential amplifier circuit D103A, the differential amplifier circuit D103C outputs to the gate line G104 bias voltage VbiasC which has a voltage value determined according to the voltage difference between reference voltage VcC supplied from the reference voltage supply node N102C and drain voltage VrbC generated at the node N103C. As does the bias voltage generating transistor T104A, the bias voltage generating transistor T104C receives, at the gate, bias voltage VbiasC output by the differential amplifier circuit D103C. Therefore, the resistance value of the channel resistance of the bias voltage generating transistor T104C changes according to a variation in the voltage value of bias voltage VbiasC. With this structure, drain voltage VrbC at the node N103C is controlled to be equal to reference voltage VcC supplied from the reference voltage supply node N102C.

Where the drain voltage of the cascode connection transistor T102RC and the drain voltage of the bias voltage generating transistor T104C are the same voltage, for example, reference voltage VcC is at a level such that the cascode connection transistor T102RC and the bias voltage generating transistor T104C can operate in a saturation region.

<Operation>

Figure 2:
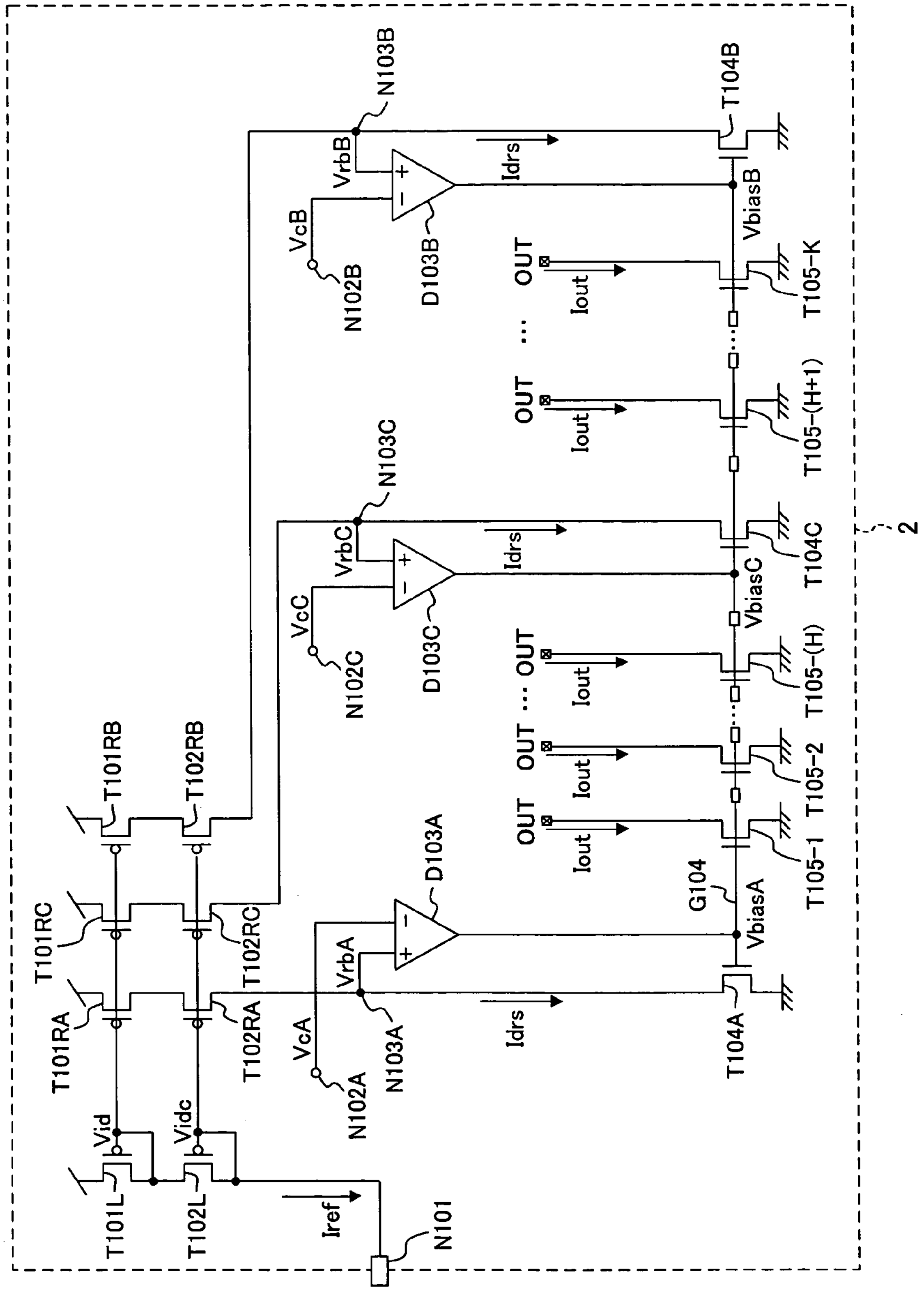
FIG. 2 shows the general structure of a current driver 2 according to embodiment 2 of the present invention.

Next, the operation of the current driver 2 shown in FIG. 2 is described. The operation of the current driver 2 is the same as that of the current driver 1 shown in FIG. 1 except for those performed by the supply reference transistor T101RC, the cascode connection transistor T102RC, the reference voltage supply node N102C, the differential amplifier circuit D103C and the bias voltage generating transistor T104C.

First, the supply reference transistor T101RC receives, at the gate, gate voltage Vid generated at the gate of the setting reference transistor T101L, and the cascode connection transistor T102RC receives, at the gate, gate voltage Vidc generated at the gate of the cascode connection transistor T102L. Thus, drain current Idrs, which has a current value determined according to the voltage value of gate voltage Vid, the voltage value of gate voltage Vidc, and the voltage value of bias voltage VbiasC, flows through the supply reference transistor T101RC, the cascode connection transistor T102RC, and the bias voltage generating transistor T104C. Meanwhile, drain voltage VrbC which has a voltage value determined according to the current value of drain current Idrs is generated at the node N103C.

Then, the differential amplifier circuit D103C receives reference voltage VcC supplied from the reference voltage supply node N102C at the inverting input terminal and drain voltage VrbC generated at the node N103C at the non-inverting input terminal and outputs to the gate line G104 bias voltage VbiasC which has a voltage value determined according to the difference between the voltage value of reference voltage VcC and the voltage value of drain voltage VrbC. Bias voltage VbiasC output to the gate line G104 is received by the bias voltage generating transistor T104C. Thus, the resistance value of the channel resistance of the bias voltage generating transistor T104C is determined according to the voltage value of bias voltage VbiasC. Thus, the resistance value of the channel resistance of the bias voltage generating transistor T104C is adjusted by bias voltage VbiasC, such that the current value of drain current Idrs flowing through the bias voltage generating transistor T104C becomes closer to the current value of reference current Iref.

Then, in a segment extending between the bias voltage generating transistor T104A and the bias voltage generating transistor T104C, the potential of the gate line G104 has a value obtained by linear interpolation between the voltage value of bias voltage VbiasA and the voltage value of bias voltage VbiasC. In a segment extending between the bias voltage generating transistor T104C and the bias voltage generating transistor T104B, the potential of the gate line G104 has a value obtained by linear interpolation between the voltage value of bias voltage VbiasC and the voltage value of bias voltage VbiasB.

Thus, in each of the driving transistors T105-1 to T105-K, output current Iout which has a current value determined according to the voltage value of a voltage applied to the gate of the transistor (potential at a connection point of the gate and the gate line G104) flows.

Herein, it is assumed that the transistor characteristic of the driving transistors T105-1 to T105-K exhibits an inverted-"V" shape characteristic where the driving transistor T105-H at the apex of "V" (the transistor characteristic linearly varies in a section between the driving transistors T105-1 and T105-(H) and in a section between the driving transistors T105-(H) and T105-K). In this case, the variation of the transistor characteristic in the section between the driving transistors T105-1 and T105-(H) is canceled by bias voltage VbiasA and bias voltage VbiasC, and the variation of the transistor characteristic in the section between the driving transistors T105-(H) and T105-K is canceled by bias voltage VbiasC and bias voltage VbiasB.

As described above, the gate line G104 is supplied not only with bias voltages VbiasA and bias voltage VbiasB, which are determined according to the transistor characteristics of the driving transistors T105-1 and T105-K at the both ends of the K driving transistors, but also with a bias voltage (herein, bias voltage VbiasC) which is determined according to the transistor characteristics of a driving transistor at an intermediate position on the gate line G104 (herein, driving transistor T105-(H)). With this structure, the potential of the gate line G104 is set to a potential determined according to the variation of the transistor characteristic among the driving transistors T105-1 and T105-K.

<Effects>

As described above, not only the both ends but also an intermediate position of the gate line G104 are supplied with bias voltages (herein, VbiasC is applied to the intermediate position) such that the potential of the gate line G104 have a value determined according to the variation of the transistor characteristic among the driving transistors T105-1 to T105-K. Thus, output currents Iout flowing through the driving transistors T105-1 to T105-K are controlled to have the same current value with high accuracy.

The supply reference transistor T101RC is preferably placed in the vicinity of the setting reference transistor T101L as the supply reference transistor T101RA is. The cascode connection transistor T102RC is preferably placed in the vicinity of the cascode connection transistor T102L as the supply reference transistor T102RA is. The bias voltage generating transistor T104C is preferably placed in the vicinity of the driving transistor T105-(H) and/or the driving transistor T105-(H+1).

Although in the above-described example of embodiment 2 only one set of a supply reference transistor, a cascode connection transistor, a reference voltage supply node, a differential amplifier circuit, and a bias voltage generating transistor is inserted, two or more sets of these elements may be inserted. With this structure, output currents Iout flowing through the driving transistors T105-1 to T105-K are controlled to have the same current value with more accuracy.

Embodiment 3

<General Structure>

Figure 3:
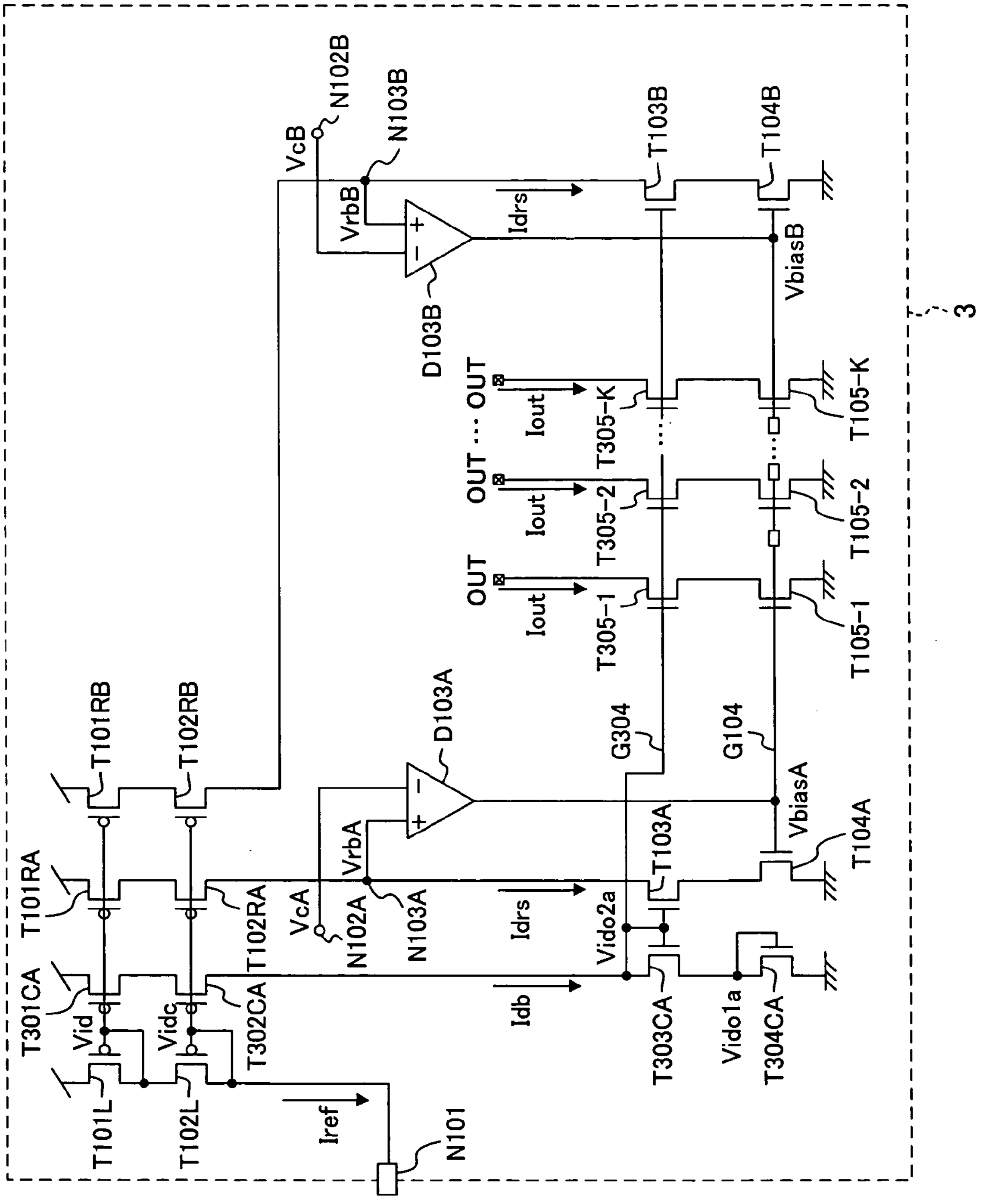
FIG. 3 shows the general structure of a current driver 3 according to embodiment 3 of the present invention.

FIG. 3 shows the general structure of a current driver 3 according to embodiment 3 of the present invention. The current driver 3 includes, in addition to the components of the current driver 1 shown in FIG. 1, cascode transistors T301CA, T302CA, T303CA and T304CA, voltage limiting transistors T103A and T103B, and K output voltage limiting transistors T305-1 to T305-K.

The cascode transistors T301CA to T304CA are connected in series between the power supply node and the ground node. The cascode transistor T301CA is connected between the power supply node and the cascode transistor T302CA and has: a gate connected to the gate of the setting reference transistor T101L. The cascode transistor T302CA is connected between the cascode transistor T301CA and the cascode transistor T303CA and has a gate connected to the gate of the cascode connection transistor T102L. The cascode transistor T303CA is connected between the cascode transistor T302CA and the cascode transistor T304CA and has a gate connected to the drain of the cascode transistor T303CA and a gate line G304. The cascode transistor T304CA is connected between the cascode transistor T303CA and the ground node, and the gate and drain of the cascode transistor T304CA are connected to each other.

The voltage limiting transistor T103A is connected between the node N103A and the bias voltage generating transistor T104A and has a gate connected to the gate line G304. The voltage limiting transistor T103B is connected between the node N103B and the bias voltage generating transistor T104B and has a gate connected to the gate line G304.

The output voltage limiting transistors T305-1 to T305-K are connected between the output node OUT and the driving transistors T105-1 to T105-K. The gates of the output voltage limiting transistors T305-1 to T305-K are connected to the gate line G304.

It is assumed that the cascode transistor T301CA exhibits the same or substantially the same transistor characteristic as that of the setting reference transistor T101L. It is also assumed that the cascode transistor T302CA exhibits the same or substantially the same transistor characteristic as that of the cascode connection transistor T102L. It is also assumed that the cascode transistor T303CA, the voltage limiting transistor T103A, the output voltage limiting transistors T305-1 to T305-K, and the voltage limiting transistor T103B exhibit the same or substantially the same transistor characteristic. It is also assumed that the cascode transistor T304CA exhibits the same or substantially the same transistor characteristic as that of the bias voltage generating transistor T104A.

<Current Mirror Structure>

The setting reference transistor T101L and the cascode transistor T301CA constitute a current mirror circuit. As does the supply reference transistor T101RA, the cascode transistor T301CA receives, at the gate, gate voltage Vid generated at the gate of the setting reference transistor T101L. Thus, drain current Idb which has a current value determined according to the voltage value of gate voltage Vid flows through the cascode transistor T301CA.

<Cascode Connection>

The cascode transistor T302CA receives, at the gate, gate voltage Vidc generated at the gate of the setting reference transistor T101L as does the supply reference transistor T102RA. Since the cascode transistor T301CA is cascode-connected to the cascode transistor T302CA, the voltage value of the drain voltage of the cascode transistor T301 CA is equal to the voltage value of the drain voltage of the setting reference transistor T101L.

Gate voltage Vido1*a* is generated at the gate of the cascode transistor T304CA. Gate voltage Vido2*a* which has a voltage value determined according to the current value of drain current Idb is generated at the gate of the cascode transistor T303CA.

The voltage limiting transistor T103A receives, at the gate, gate voltage Vido2*a* generated at the gate of the cascode transistor T303CA. Each of the output voltage limiting transistors T305-1 to T305-K receives, at the gate, gate voltage Vido2*a* generated at the gate of the cascode transistor T303CA. The voltage limiting transistor T103B receives, at the gate, gate voltage Vido2*a* generated at the gate of the cascode transistor T303CA.

The voltage value of the drain voltage of each of the bias voltage generating transistor T104A, the driving transistors T105-1 to T105-K, and the bias voltage generating transistor T104B is equal to the voltage value of gate voltage Vido1*a* of the cascode transistor T304CA.

<Operation>

Next, the operation of the current driver 3 shown in FIG. 3 is described. The operation of the current driver 3 is the same as that of the current driver 1 shown in FIG. 1 except for those performed by the cascode transistors T301CA to T304CA, the voltage limiting transistors T103A and T103B, and the output voltage limiting transistors T305-1 to T305-K.

First, the cascode transistor T301CA receives, at the gate, gate voltage Vid generated at the gate of the setting reference transistor T101L, and the cascode transistor T302CA receives, at the gate, gate voltage Vidc generated at the gate of the cascode connection transistor T102L. Thus, drain current Idb which has a current value determined according to the voltage value of gate voltage Vidc flows through the cascode transistors T301CA to T304CA. Gate voltage Vido2*a* is generated at the gate of the cascode transistors T303CA, and gate voltage Vido1*a* is generated at the gate of the cascode transistors T304CA.

Next, the gate line G304 receives gate voltage Vido2*a* generated at the gate of the cascode transistors T303CA. The voltage limiting transistor T103A receives, at the gate, gate voltage Vido2*a* supplied to the gate line G304. Each of the output voltage limiting transistors T305-1 to T305-K and the voltage limiting transistor T103B receives gate voltage Vido2*a* at the gate as does the voltage limiting transistor T103A. Since the gates of the voltage limiting transistors T103A and T103B and the output voltage limiting transistors T305-1 to T305-K are supplied with the same gate voltage Vido2*a*, the variation of the drain voltage in the bias voltage generating transistors T104A and T104B and the driving transistors T105-1 to T105-K is reduced.

<Setting of Drain Voltage>

For example, by securing an appropriate transistor performance for the cascode transistors T303CA, the voltage limiting transistors T103A and T103B and the output voltage limiting transistors T305-1 to T305-K, the source voltage of each of these transistors is prevented from being greatly changed.

Securement of the transistor performance is specifically described below.

$$Ids=(\beta/2)(Vgs-Vt)^2 \quad \text{(Expression 1)}$$

where Ids: drain current, Vgs: gate voltage, Vt: threshold voltage.

$$\beta=(W/L)\mu Cox \quad \text{(Expression 2)}$$

where W: channel length, L: channel width, μ: electron mobility, Cox: gate capacitance.

$$\beta/2=500\ (\mu A/V^2) \quad \text{(Expression 3)}$$

In general, the current value of a drain current flowing through a transistor is expressed by Expression 1. It should be noted that "β" in Expression 1 is a parameter which represents the transistor performance as expressed by Expression 2. Herein, it is assumed that the transistor performance of the voltage limiting transistors T103A and T103B and the output voltage limiting transistors T305-1 to T305-K is set such that β/2 is about 500 $\mu A/V^2$ as specified in Expression 3. In this case, even if the current values of output currents Iout flowing through the driving transistors T105-1 to T105-K change from "1 μA" to "10 μA", voltage Vgs between the gate and source changes by only 0.1 V.

With a change of this level, the change of the drain current (=output current Iout) due to the drain voltage dependence is small.

<Effects>

As described above, in the current driver 3, the drain voltage of the bias voltage generating transistors T104A and T104B and the driving transistors T105-1 to T105-K is set by the voltage limiting transistors T103A and T103B and the output voltage limiting transistors T305-1 to T305-K. With this structure, a change in the current value of output current Iout due to the drain voltage dependence is reduced. Thus, output currents Iout flowing through the driving transistors T105-1 to T105-K are controlled to have the same current value with high accuracy.

Embodiment 4

<Change in Potential of Gate Line G304>

The drains of the output voltage limiting transistors T305-1 to T305-K are connected to a display element circuit (not shown) through output nodes OUT. Therefore, there is a possibility that a change of the load capacitance in the display element circuit causes a change in the drain voltage of each of the output voltage limiting transistors T305-1 to T305-K. In this case, there is a possibility that the capacitance coupling by the capacitance existing between the drain and gate of the output voltage limiting transistors T305-1 to T305-K causes a change in the potential of the gate line G304.

<General Structure>

Figure 4:
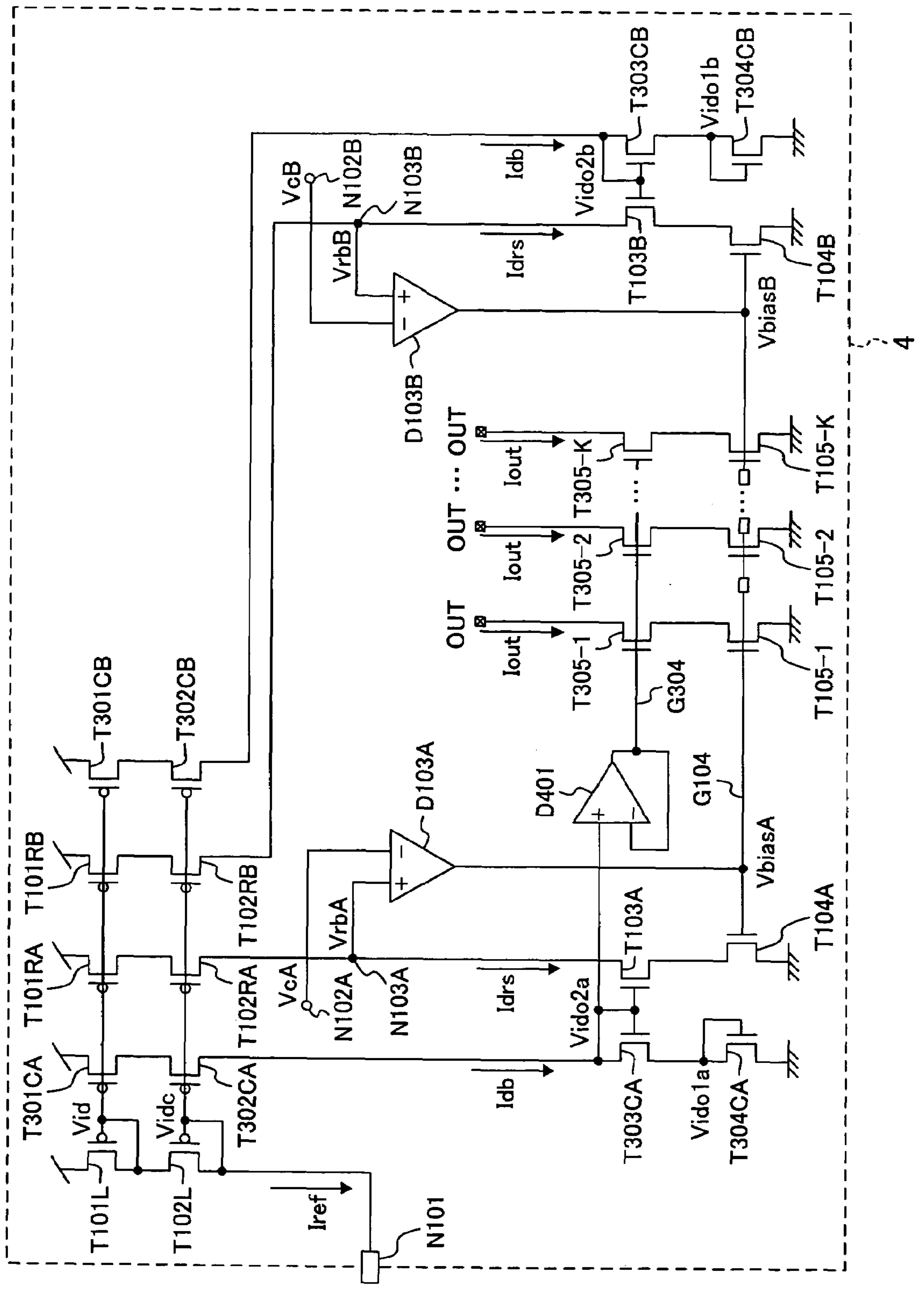
FIG. 4 shows the general structure of a current driver 4 according to embodiment 4 of the present invention.

FIG. 4 shows the general structure of a current driver 4 according to embodiment 4 of the present invention. The current driver 4 includes cascode transistors T301CB, T302CB, T303CB and T304CB and a differential amplifier circuit D401 in addition to the components of the current driver 3 shown in FIG. 3. It should be noted that the gate of the voltage limiting transistor T103B is connected to the gate of the cascode transistor T303CB. The gates of the output voltage limiting transistors T305-1 to T305-K are connected to the gate line G304.

The cascode transistors T301CB to T304CB are connected in series between the power supply node and the ground node.

The cascode transistor T301CB is connected between the power supply node and the cascode transistor T302CB and has a gate connected to the gate of the setting reference transistor T101L. The cascode transistor T302CB is connected between the cascode transistor T301CB and the cascode transistor T303CB and has a gate connected to the gate of the cascode connection transistor T102L.

The cascode transistor T303CB is connected between the cascode transistor T302CB and the cascode transistor T304CB, and the gate and drain of the cascode transistor T303CB are connected to each other. The cascode transistor T304CB is connected between the cascode transistor T303CB and the ground node, and the gate and drain of the cascode transistor T304CB are connected to each other.

The differential amplifier circuit D401 is a voltage follower circuit which has a non-inverting input terminal connected to the gate of the cascode transistor T303CA and an inverting input terminal connected to the output terminal of the circuit D401 and the gate line G304.

It is assumed that the cascode transistor T301CB exhibits the same or substantially the same transistor characteristic as that of the setting reference transistor T101L. It is also assumed that the cascode transistor T302CB exhibits the same or substantially the same transistor characteristic as that of the setting reference transistor T101L. It is also assumed that the cascode transistor T303CB exhibits the same or substantially the same transistor characteristic as that of the voltage limiting transistor T103B. It is also assumed that the cascode transistor T304CB exhibits the same or substantially the same transistor characteristic as that of the bias voltage generating transistor T104B.

<Operation>

Next, the operation of the current driver 4 shown in FIG. 4 is described. The operation of the current driver 4 is the same as that of the current driver 3 shown in FIG. 3 except for those performed by the cascode transistors T301CB to T304CB, the voltage limiting transistor T103B, and the differential amplifier circuit D401.

First, the cascode transistors T301CB to T304CB perform the same operation as that performed by the cascode transistors T301CA to T304CA. Therefore, gate voltage Vido2*b* is generated at the gate of the cascode transistor T303CB.

The differential amplifier circuit D401 receives gate voltage Vido2*a* generated at the gate of the cascode transistor T303CA and outputs an output voltage to the gate line G304 according to the voltage value of gate voltage Vido2*a*.

The gate line G304 receives the output voltage from the differential amplifier circuit D401.

<Change in Potential of Gate Line G304>

Since the output impedance of the differential amplifier circuit is low, a change in the potential of the gate line G304 due to the capacitance coupling can be decreased.

<Effects>

As described above, the impedance of the gate line G304 is decreased by supplying the output voltage from the differential amplifier circuit D401 to the gate line G304. Therefore, the change in the potential of the gate line G304 is decreased. Thus, output currents Iout flowing through the driving transistors T105-1 to T105-K are controlled to have the same current value with high accuracy.

Embodiment 5

<General Structure>

Figure 5:
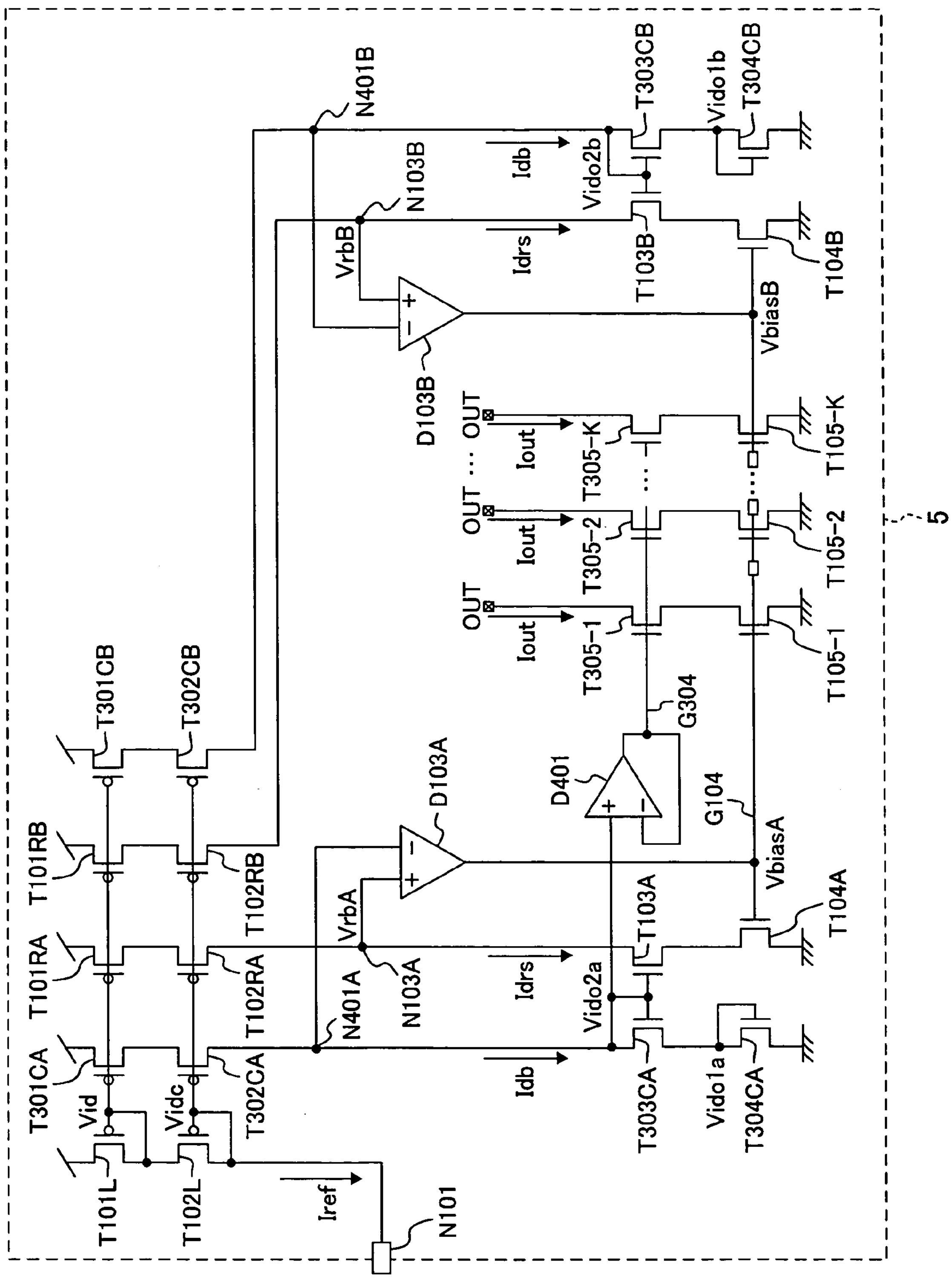
FIG. 5 shows the general structure of a current driver 5 according to embodiment 5 of the present invention.

FIG. 5 shows the general structure of a current driver 5 according to embodiment 5 of the present invention. The current driver 5 has the same structure as that of the current driver 4 shown in FIG. 4 except that the reference current supply nodes N102A and N102B are omitted from the structure of FIG. 4. The non-inverting input terminal of the differential amplifier circuit D103A is connected to a node N401A which exists between the cascode transistor T302CA and the cascode transistor T303CA. The inverting input terminal of the differential amplifier circuit D103B is connected to a node N401B which exists between the cascode transistor T302CB and the cascode transistor T303CB.

The differential amplifier circuit D103A outputs to the gate line G104 bias voltages VbiasA which has a voltage value determined according to the voltage difference between the drain voltage generated at the node N401A (gate voltage Vido2*a*) and drain voltage VrbA generated at the node N103A.

The differential amplifier circuit D103B outputs to the gate line G104 bias voltages VbiasB which has a voltage value determined according to the voltage difference between the drain voltage generated at the node N401B (gate voltage Vido2*b*) and drain voltage VrbB generated at the node N103B.

<Operation>

Next, the operation of the current driver 5 shown in FIG. 5 is described. The operation of the current driver 5 is the same as that of the current driver 4 shown in FIG. 4 except for those performed by the differential amplifier circuits D103A and D103B.

The differential amplifier circuit D103A outputs to the gate line G104 bias voltages VbiasA which has a voltage value determined according to the voltage difference between the drain voltage generated at the node N401A and drain voltage VrbA generated at the node N103A. The bias voltage generating transistor T104A receives, at the gate, bias voltages VbiasA output from the differential amplifier circuit D103A. Therefore, the resistance value of the channel resistance of the bias voltage generating transistor T104A changes according to a variation in the voltage value of bias voltages VbiasA. Thus, drain voltage VrbA at the node N103A is controlled to be equal to the drain voltage generated at the node N401A.

The differential amplifier circuit D103B outputs to the gate line G104 bias voltages VbiasB which has a voltage value determined according to the voltage difference between the drain voltage generated at the node N401B and drain voltage VrbB generated at the node N103B. The bias voltage generating transistor T104B receives, at the gate, bias voltages VbiasB output from the differential amplifier circuit D103B. Therefore, the resistance value of the channel resistance of the bias voltage generating transistor T104B changes according to a variation in the voltage value of bias voltages VbiasB. Thus, drain voltage VrbB at the node N103B is controlled to be equal to the drain voltage generated at the node N401B.

<Effects>

As described above, in the current driver 4, voltage Vido2*a* (Vido2*b*) is supplied to the inverting input terminal of the differential amplifier circuit D103A (D103B) without an exclusive voltage generation circuit for generating reference voltages VcA and VcB. Therefore, the voltage generation circuit for generating reference voltages VcA and VcB is unnecessary, and thus, the circuit scale can be decreased.

Embodiment 6

<Generally-Employed Current Driver>

To output a driving current having an arbitrary gray level to a display element circuit (organic EL element) for one pixel, the current driver has switches between the display element circuit and the driving transistors T105-1 to T105-K. The switches are turned ON/OFF according to the gray level of representation data for one pixel. For example, in the case where the representation data is 4-bit data (16 gray levels), 15 driving transistors are provided for one pixel. Connected between the 15 driving transistors T105-1 to T105-15 and the display element circuit for one pixel are 15 switches. Among 15 output currents Iout flowing through the driving transistors T105-1 to T105-15, the number of output currents Iout supplied to the display element circuit is determined by turning ON/OFF the 15 switches. With this mechanism, the driving current of 16 gray levels is output to the display element circuit (organic EL element).

There is an alternative structure wherein a switch is connected between one driving transistor (T105-1) and a corresponding display element circuit for one pixel, a switch is connected between two driving transistors (T105-2, T105-3) and corresponding display element circuits, a switch is connected between four driving transistors (T105-4 to T105-7) and corresponding display element circuits, and a switch is connected between eight driving transistors (T105-8 to T105-15) and corresponding display element circuits. However, the description of this alternative structure is herein omitted.

<General Structure>

Figure 6:
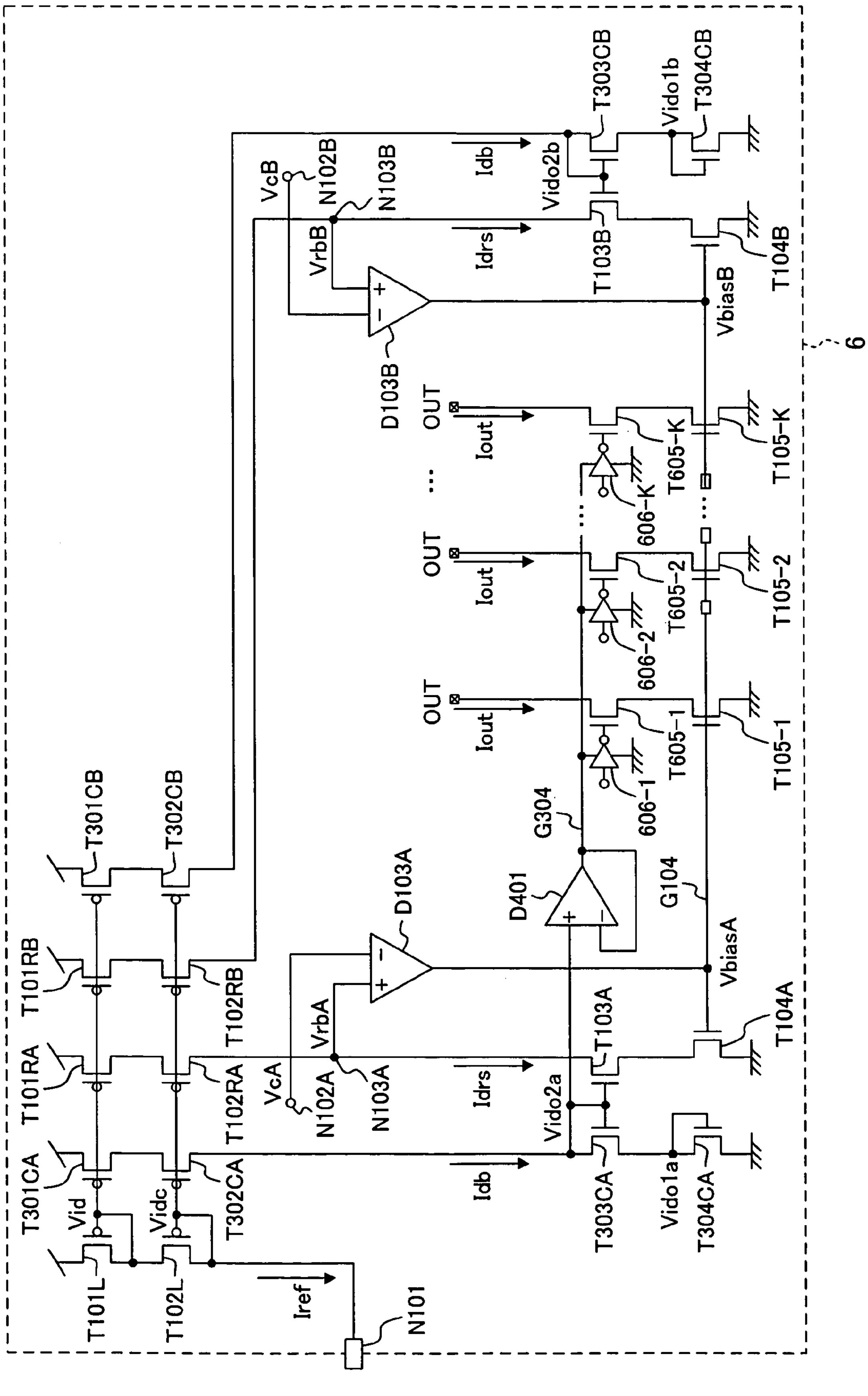
FIG. 6 shows the general structure of a current driver 6 according to embodiment 6 of the present invention.

FIG. 6 shows the general structure of a current driver 6 according to embodiment 6 of the present invention. The current driver 5 has the same structure as that of the current driver 4 shown in FIG. 4 except that the current driver 5 includes switch transistors T605-1 to T605-K and inverter circuits 606-1 to 606-K in place of the output voltage limiting transistors T305-1 to T305-K shown in FIG. 4. Each of the switch transistors T605-1 to T605-K is connected between a corresponding output node OUT and a corresponding one of the driving transistors T105-1 to T105-K and has a gate connected to the output terminal of a corresponding one of the inverter circuits 606-1 to 606-K. Each of the inverter circuits 606-1 to 606-K has two voltage input terminals, one (H-level voltage input terminal) being connected to the gate line G304, and the other (L-level voltage input terminal) being connected to the ground node. Each of the inverter circuits 606-1 to 606-K outputs any one of a H-level signal and a L-level signal according to a control signal from an external device. The control signal indicates ON or OFF. The potential of the H-level signal is equal to the potential of the H-level voltage input terminal (herein, the potential at a connection point of the H-level voltage input terminal of the inverter circuit and the gate line G304). The potential of the L-level signal is equal to the potential of the L-level voltage input terminal (herein, the potential of the ground node).

It should be noted that the switch transistors T605-1 to T605-K are assumed to exhibit the same or substantially the same transistor characteristic as that of the voltage limiting transistors T103A and T103B.

<Operation>

Next, the operation of the current driver 6 shown in FIG. 6 is described. The operation of the current driver 6 is the same as that of the current driver 4 shown in FIG. 4 except for those performed by the switch transistors T605-1 to T605-K and the inverter circuits 606-1 to 606-K. Since the switch transistors T605-1 to T605-K have the same structure and the inverter circuits 606-1 to 606-K have the same structure, the operation performed by the switch transistor T605-1 and the inverter circuit 606-1 is described below as an example.

[If Control Signal Indicates "ON"]

First, the case where a control signal indicative of "ON" is input to the inverter circuit 606-1 is described.

In this case, the inverter circuit 606-1 outputs a H-level signal to the gate of the switch transistor T605-1. That is, the gate of the switch transistor T605-1 is supplied with the potential of the connection point of the H-level voltage input terminal of the inverter circuit 606-1 and the gate line G304 (=gate voltage Vido2*a*). Thus, the voltage value of the drain voltage of the driving transistor T105-1 is equal to the voltage value of the drain voltage of the bias voltage generating transistor T104A.

[If Control Signal Indicates "OFF"]

Next, the case where a control signal indicative of "OFF" is input to the inverter circuit 606-1 is described.

In this case, the inverter circuit 606-1 outputs a L-level signal to the gate of the switch transistor T605-1. Therefore, the switch transistor T605-1 is not activated.

Thus, among the switch transistors T605-1 to T605-K, an activated transistor has a source voltage set to "Vido2*b*-Vt (Vt: threshold voltage of switch transistors)".

<Effects>

As described above, among the driving transistors T105-1 to T105-K, the drain voltages of driving transistors from which output currents Iout are to be output are set to the same voltage value. With this structure, a change in the current value of output current Iout due to the drain voltage dependence is reduced. Thus, output currents Iout flowing through the driving transistors T105-1 to T105-K are controlled to have the same current value with high accuracy.

The structure for setting the drain voltages of the driving transistors T105-1 to T105-K and the structure for generating a driving current supplied to the display element circuit (organic EL element) share overlapping components. Therefore, the circuit scale of the current driver is decreased.

Embodiment 7

<General Structure>

Figure 7A:
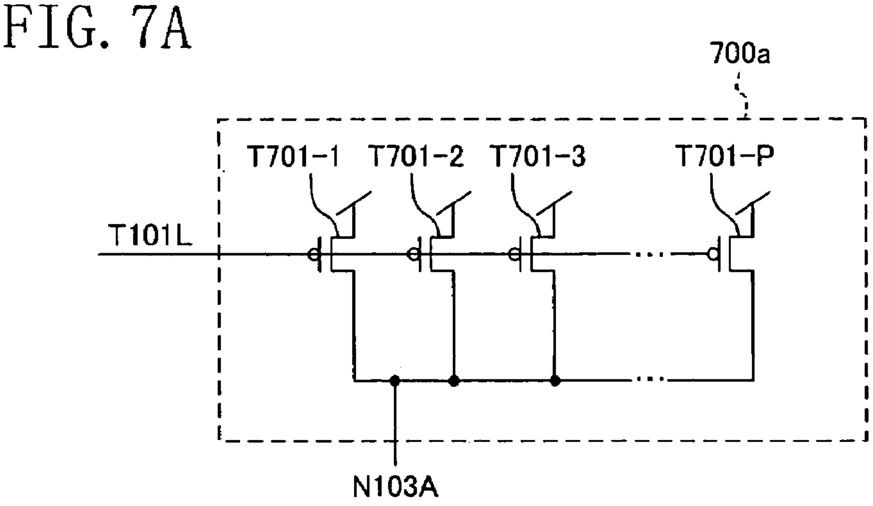
FIG. 7A shows the internal structure of a current-voltage conversion section 700*a* incorporated in a current driver according to embodiment 7 of the present invention.

A current driver according to embodiment 7 of the present invention has the same structure as that of the current driver 1 shown in FIG. 1 except that the current driver of embodiment 7 includes a current-voltage converter 700*a* shown in FIG. 7A in place of the supply reference transistor T101RA shown in FIG. 1. The current-voltage converter 700*a* includes P current-voltage conversion transistors T701-1 to T701-P (P is a natural number). Each of the current-voltage conversion transistors T701-1 to T701-P is connected between the power supply node and the node N103A (FIG. 1) and has a gate connected to the gate of the setting reference transistor T101L (FIG. 1).

<Operation>

Next, the operation of the current-voltage converter 700*a* shown in FIG. 7A is described.

Each of the current-voltage conversion transistors T701-1 to T701-P receives, at the gate, gate voltage Vid generated at the gate of the setting reference transistor T101L (FIG. 1). Therefore, drain currents 1701-1 to 1701-P, which have current values determined according to the voltage value of gate voltage Vid, flow through the current-voltage conversion transistors T701-1 to T701-P, respectively. Accordingly, the total of drain currents I701-1 to 1701-P flows through the bias voltage generating transistor T104A.

<Effects>

As described above, the supply reference transistor T101RA is formed by a plurality of transistors. With this structure, the influence of the variation in the transistor characteristic of the transistors included in the supply reference transistor T101RA is decreased. Further, the current-voltage conversion transistors T701-1 to T701-P are placed in the vicinity of each other, whereby the variation of the transistor characteristic is further decreased.

It should be noted that the current-voltage conversion transistors T701-1 to T701-P may or may not have the same transistor characteristic.

The above-described effects can be achieved even when the current driver shown in FIG. 1 includes the current-voltage converter 700*a* shown in FIG. 7A in place of the supply reference transistor T101RB. In this case, each of the current-voltage conversion transistors T701-1 to T701-P is connected between the power supply node and the node N103B and has a gate connected to the gate of the setting reference transistor T101L.

<Variations>

Figure 7B:
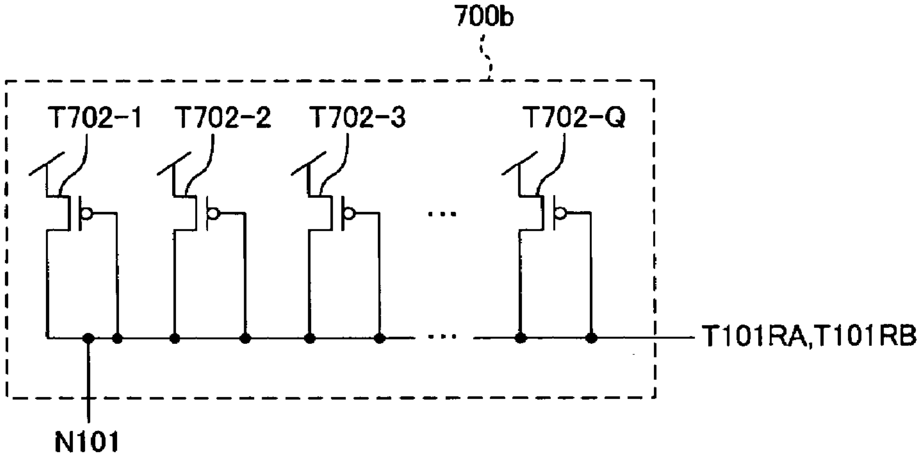
FIG. 7B shows the internal structure of a current-voltage conversion section 700*b* incorporated in a current driver according to a variation of embodiment 7 of the present invention.

A structure is also possible wherein the current driver 1 shown in FIG. 1 includes a current-voltage converter 700*b* shown in FIG. 7B in place of the setting reference transistor T101L. The current-voltage converter 700*b* includes Q current-voltage conversion transistors T702-1 to T702-Q (Q is a natural number). Each of the current-voltage conversion transistors T702-1 to T702-Q is connected between the power supply node and the reference current input node N101 (FIG. 1), and the gate and drain of each current-voltage conversion transistor are connected to each other. The drain (gate) of each of the current-voltage conversion transistors T702-1 to T702-Q is connected to the reference current input node N101 and the gates of the supply reference transistors T101RA and T101RB. With this structure, the influence of the variation in the transistor characteristic of the setting reference transistor T101L is decreased.

An alternative structure is also possible wherein the current driver 1 shown in FIG. 1 includes the current-voltage converter 700*b* of FIG. 7B in place of the setting reference transistor T101L of FIG. 1 and the current-voltage converter 700*a* of FIG. 7A in place of the supply reference transistors T101RA and T101RB of FIG. 1. That is, it is possible that the setting reference transistor T101L and the supply reference transistors T101RA and T100RB of FIG. 1 are each formed by a plurality of transistors. In this case, it is preferable that the transistors included in the setting reference transistor T101L, the transistors included in the supply reference transistor T101RA, and the transistors included in the supply reference transistor T101RB are uniformly distributed over one chip. With this structure, the variation of the transistor characteristic of the transistors included in the setting reference transistor T101L and supply reference transistors T101RA and T100RB is uniform. Thus, the influence of the variation in the transistor characteristic of the transistors is decreased.

Embodiment 8

<General Structure>

Figure 8:
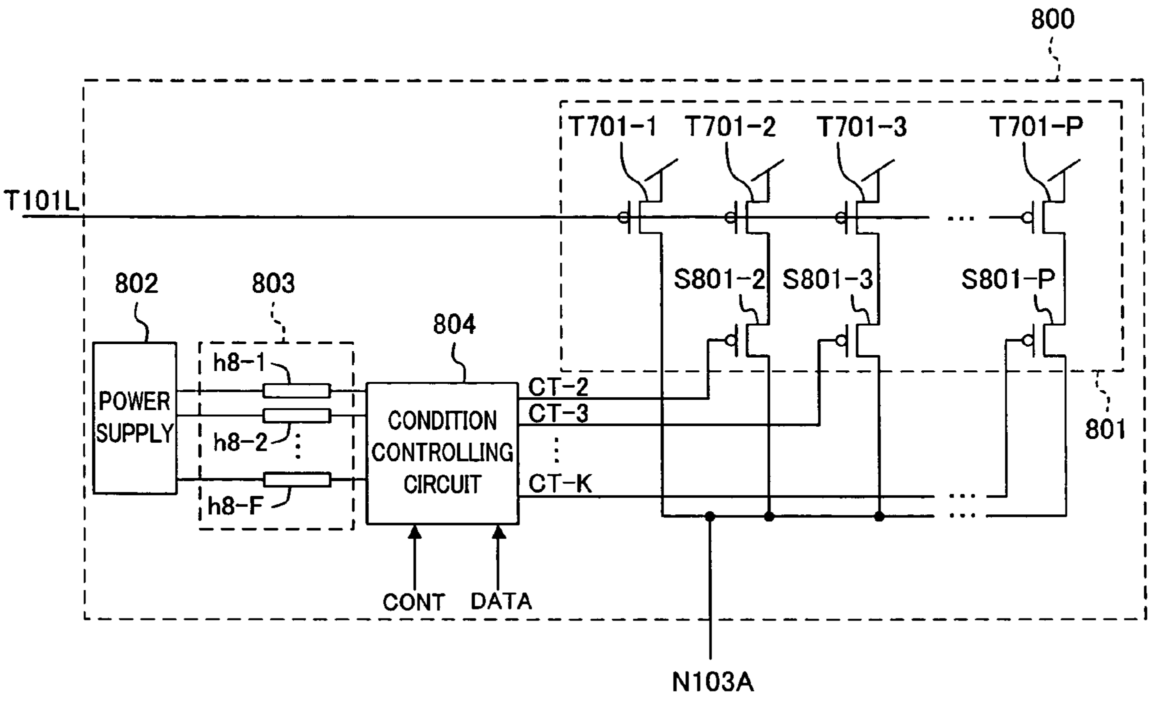
FIG. 8 shows the internal structure of a bias voltage adjusting section 700*a* incorporated in a current driver according to embodiment 8 of the present invention.

A current driver according to embodiment 8 of the present invention has the same structure as that of the current driver 1 shown in FIG. 1 except that the current driver of embodiment 8 includes a bias voltage adjusting section 800 shown in FIG. 8 in place of the supply reference transistor T101RA of FIG. 1. The bias voltage adjusting section 800 generates drain current Idrs according to gate voltage Vid of the setting reference transistor T101L.

<Internal Configuration of Bias Voltage Adjusting Section 800>

The bias voltage adjusting section 800 includes: a current-voltage converting unit 801; a power supply 802, a condition storing unit 803; and a condition controlling circuit 804.

The current-voltage converting unit 801 includes the current-voltage conversion transistors T701-1 to T701-P shown in FIG. 7A and (P-1) selection transistors S801-2 to S801-P. The selection transistors S801-2 to S801-P correspond to the current-voltage conversion transistors T701-2 to T701-P on a one-to-one basis. The selection transistors S801-2 to S801-P are connected between the corresponding current-voltage conversion transistors T701-2 to T701-P and the node N103A to receive control signals CT-2 to CT-P from the condition controlling circuit 804 at the gate.

When control signals CT-2 to CT-P are at the L level, these signals are voltages for activating the selection transistors S801-2 to S801-P (PMOS transistors) whereas when control signals CT-2 to CT-P are at the H level, these signals are voltages for inactivating the selection transistors S801-2 to S801-P.

The power supply 802 supplies a read-out voltage to the condition controlling circuit 804 and the condition storing unit 803. The read-out voltage is a voltage for determining the connection state in the condition storing unit 803.

The condition storing unit 803 includes F fuses h8-1 to h8-F (F is a natural number). Each of the fuses h8-1 to h8-F is made of a material capable of changing from conducting to nonconducting when being blown by application of a laser or a large current. The condition storing unit 803 stores binary data of F bits by expressing the states (i.e., blown or not blown) of the fuses h8-1 to h8-F in binary numbers. In this embodiment, it is assumed that the condition storing unit 803 stores binary data representing the number of transistors to be used out of the current-voltage conversion transistors T701-2 to T701-P. For example, when the fuse h8-1 is blown and the other fuses h8-2 to h8-M are not blown, the condition storing unit 803 stores data showing that the number of transistors to be used is "one". On the other hand, when the fuses h8-1 and h8-2 are blown and the other fuses h8-3 to h8-M are not blown, the condition storing unit 803 stores data showing that the number of transistors to be used is "three".

The condition controlling circuit 804 enters a condition-fixed mode or an emulation mode according to control signal CONT input from outside the circuit.

In the condition-fixed mode, the condition controlling circuit 804 connects one terminal of each of the fuses h8-1 to h8-F included in the condition storing unit 803 to the condition controlling circuit 804 itself so as to read voltage levels represented by the fuses h8-1 to h8-F. In this manner, binary data expressed by the states (i.e., blown or not blown) of the fuses is read out. The condition controlling circuit 804 outputs control signals CT-2 to CT-P by decoding the binary data that has been read out. For example, when the fuses h8-1 and h8-2 are blown in the condition storing unit 803 (i.e., when binary data showing that the number of transistors to be used is "three" is stored in the condition storing unit 803), the voltage levels represented by the fuses h8-1 to h8-F are "L, L, H, . . . , H". In this case, the condition controlling circuit 804 sets control signals CT-2 to CT-4 at the L level and the other control signals CT-5 to CT-P at the H level.

In the emulation mode, the condition controlling circuit 804 emulates the states (i.e., blown or not blown) of the fuses h8-1 to h8-F in the condition storing unit 803 according to data signal DATA input from outside the circuit, and outputs control signals CT-2 to CT-P. Data signal DATA is a signal for emulating the states (i.e., blown or not blown) of the fuses in the condition storing unit 803 (information stored in the condition storing unit 803) and shows M voltage levels according to the states (i.e., blown or not blown) of the fuses. For example, in the case of data signal DATA for emulating a state in which the fuse h8-1 is blown (the state where information showing that the number of voltage generating transistors to be used is "one" is stored in the condition storing unit 803), the F voltage levels shown by this data signal DATA are "L, H, H, . . . , H". In this case, the condition controlling circuit 804 sets control signal CT-2 at the L level and the other control signals CT-3 to CT-P at the H level. On the other hand, in the case of data signal DATA for emulating a state in which the fuses h8-1 and h8-2 are blown, the F voltage levels shown by this data signal DATA are "L, L, H, . . . , H". In this case, the condition controlling circuit 804 sets control signals CT-2 to CT-4 at the L level and the other control signals CT-5 to CT-P at the H level.

<Operation>

Now, operation of the bias voltage adjusting section 800 illustrated in FIG. 8 will be described.

[Condition-Fixed Mode]

When receiving control signal CONT which requires switching to the condition-fixed mode, the condition controlling circuit 804 enters a condition-fixed mode.

Then, the condition controlling circuit 804 connects one terminal of each of the fuses h8-1 to h8-F included in the condition storing unit 803 to the condition controlling circuit 804 itself, and reads binary data represented by the states (i.e., blown or not blown) of the fuses.

Thereafter, the condition controlling circuit 804 decodes the binary data that has been read out and outputs control signals CT-2 to CT-P to the gates of the corresponding selection transistors S801-2 to S801-P, respectively.

When the fuse h8-1 is blown, the condition controlling circuit 804 sets control signal CT-2 at the L level and the other control signals CT-3 through CT-P at the H level. Accordingly, the selection transistor S801-2 is activated and the current-voltage converting transistor T701-2 is connected to the node N103A, so that the current-voltage conversion transistors T701-1 and T701-2 are connected to the node N103A. Accordingly, a drain current ("1701-1"+"I701-2") that is the sum of drain current 1701-1 determined by the current mirror ratio between the setting reference transistor T101L and the current-voltage conversion transistors T701-1 and drain current 1701-2 determined by the current mirror ratio between the setting reference transistor T101L and the current-voltage conversion transistors 1701-2 flows in a bias voltage generating transistor T104A. This makes bias voltage VbiasA applied to the gate of the bias voltage generating transistor T104A set at a voltage value determined according to the current value of the drain current ("1701-1"+"1701-2").

In this manner, binary data stored in the condition storing unit 803 is decoded, so that the output states of control signals CT-2 to CT-P are reproduced. In addition, these output states are maintained.

[Emulation Mode]

When receiving a control signal CONT which requires switching to the emulation mode, the condition controlling circuit 804 enters an emulation mode.

Then, the condition controlling circuit 804 outputs control signals CT-2 to CT-P according to data signal DATA.

In this case, suppose data signal DATA shows that "none of the fuses h8-1 to h8-F is blown". Then, all control signals CT-2 to CT-P output from the condition controlling circuit 804 are at the H level (inactive). Accordingly, none of the selection transistors S801-2 to S801-P is activated and none of the current-voltage conversion transistors T701-2 to T701-P is connected to the node N103A, so that only the current-voltage conversion transistors T701-1 is connected to the node N103A. Therefore, drain current T701-1 determined by the current mirror ratio between the setting reference transistor T101L and the current-voltage conversion transistors T701-1 flows in the bias voltage generating transistor T104A. Thus, bias voltage VbiasA which is applied to the gate of the bias voltage generating transistor T104A is set to a voltage value determined according to the current value of drain current T701-1.

In the above described manner, the states (i.e., blown or not blown) of the fuses h8-1 to h8-F in the condition storing unit 803 are emulated according to data signal DATA, whereby the performance ratio between the setting reference transistor T100L and the current-voltage converting unit 801 is arbitrarily set. This enables adjustment of the current value of drain current Id flowing in the bias voltage generating transistor T104A.

<Effects>

As described above, the performance of the current-voltage converting unit 801 is adjusted by the condition controlling circuit 804, so that the current driver is allowed to operate under conditions (optimum conditions) in which the states of output currents Iout in the driving transistors T105-1 to T105-K are optimized.

In addition, if the output states of control signals CT-2 to CT-P are stored by blowing the fuses h8-1 to h8-F included in the condition storing unit 803 based on the emulation result, the conditions achieved when output currents Iout are in optimum states are maintained.

In this embodiment, the condition storing unit 803 including a plurality of fuses is used to store the number of transistors which are to be selected from the current-voltage conversion transistors T701-1 to T701-P by the condition controlling circuit 804 (i.e., the output states of control signals CT-2 to CT-P). Alternatively, however, the current driver may have a configuration in which data representing the output states of control signals CT-2 to CT-P are stored in a storage medium such as a DRAM (dynamic random access memory) or an SRAM (static random access memory) and is decoded so as to output control signals CT-2 to CT-P.

Alternatively, the condition controlling circuit 804 may operate using the condition-fixed mode as a default. That is, the condition controlling circuit 804 may be always in the condition-fixed mode except for the emulation mode.

Alternatively, to reduce the number of fuses to be blown, a setting may be used such that the number of fuses to be blown increases based on the conditions achieved when output currents Iout are in optimum states. For example, suppose output currents Iout are in optimum states when any two of the current-voltage conversion transistors T701-1 to T701-P are used, the condition controlling circuit 804 decodes binary data stored in the condition storing unit 803 such that control signals CT-2 and CT-3 are at the L level and the other control signals CT-4 to CT-P are at the H level when the voltage levels represented by the fuses h8-1 to h8-F are “H, H, H, . . . , H”.

Embodiment 9

<General Structure>

Figure 9:
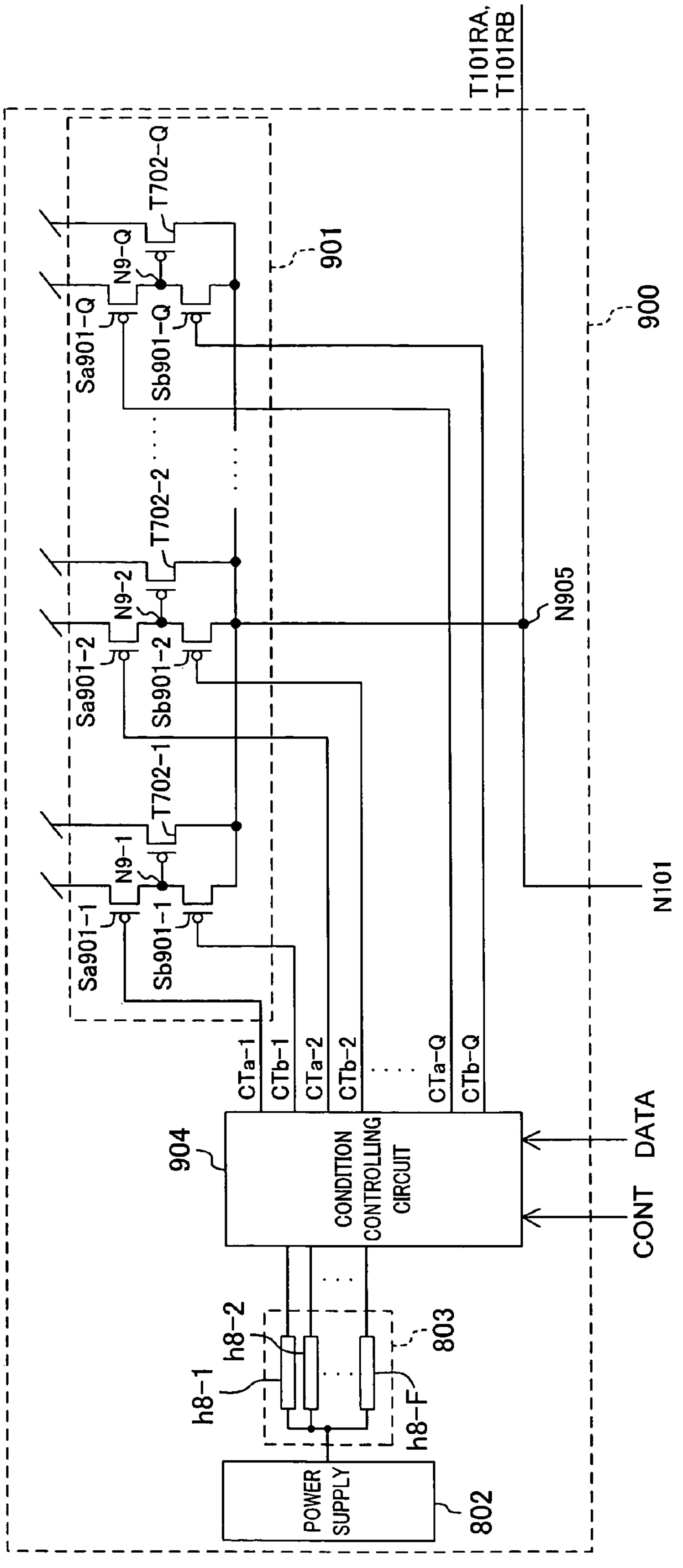
FIG. 9 shows the internal structure of a gate voltage adjusting section incorporated in a current driver according to embodiment 9 of the present invention.

A current driver according to embodiment 9 of the present invention has the same structure as that of the current driver 1 shown in FIG. 1 except that the current driver of embodiment 9 includes a gate voltage adjusting section 900 shown in FIG. 9 in place of the setting reference transistor T101L of FIG. 1. The gate voltage adjusting section 900 generates a gate voltage which has a voltage value determined according to the current value of reference current Iref.

<Internal Configuration of Gate Voltage Adjusting Section 900>

The gate voltage adjusting section 900 shown in FIG. 9 includes: a current-voltage converting unit 901; a power supply 802; a condition storing unit 803; and a condition controlling circuit 904.

The current-voltage converting unit 901 includes: Q selection transistors T702-1 to T702-Q; Q selection transistors Sa901-1 to Sa901-Q; and Q selection transistors Sb901-1 to Sb901-Q. The selection transistors Sa901-1 to Sa901-Q and selection transistors Sb901-1 to Sb901-Q are connected in series between the power supply node and a node N905. The selection transistors Sa901-1 to Sa901-Q receive, at their gates, control signals CTa-1 to CTa-Q, respectively, from the condition controlling circuit 904. The selection transistors Sb901-1 to Sb901-Q receive, at their gates, control signals CTb-1 to CTb-Q, respectively, from the condition controlling circuit 904. The selection transistors T702-1 to T702-Q are provided between the power supply node and the node N905 and have gates connected to nodes N9-1 to N9-Q, respectively. The node N905 is connected to the gates of the supply reference transistors T101RA and T101RB and the reference current input node N101 (FIG. 1).

When control signals CTa-1 to CTa-Q and CTb-1 to CTb-Q are at the L level, these signals are voltages for activating the selection transistors Sa901-1 to Sa901-Q and Sb901-1 to Sb901-Q (PMOS transistors), whereas when control signals CTa-1 to CTa-Q and CTb-1 to CTb-Q are at the H level, these signals are voltages for inactivating the selection transistors Sa901-1 to Sa901-Q and Sb901-1 to Sb901-Q.

The power supply 802 is the same as that illustrated in FIG. 8.

The condition storing unit 803 is the same as that illustrated in FIG. 8. In this embodiment, it is assumed that the condition storing unit 803 stores binary data showing the number of transistors to be used out of the current-voltage converting transistors T702-1 to T702-Q. For example, when a fuse h8-1 is blown and the other fuses h8-2 through h8-F are not blown, the condition storing unit 803 stores data showing that the number of transistors to be used is “one”. On the other hand, when the fuses h8-1 and h8-2 are blown and the other fuses h8-3 through h8-F are not blown, the condition storing unit 803 stores data showing that the number of transistors to be used is “three”.

As does the condition controlling circuit 804, the condition controlling circuit 904 enters a condition-fixed mode or an emulation mode according to control signal CONT input from outside the circuit.

In the condition-fixed mode, as does the condition controlling circuit 804, the condition controlling circuit 904 decodes binary data stored in the condition storing unit 803, thereby outputting control signals CTa-1 to CTa-Q and CTb-1 to CTb-Q. For example, when the fuse h8-1 is blown in the condition storing unit 803, the condition controlling circuit 904 sets control signal CTa-1 at the H level, control signals CTa-2 to CTa-Q at the L level, control signal CTb-1 at the L level, and control signals CTb-2 through CTb-Q at the H level.

In the emulation mode, as does the condition controlling circuit 804, the condition controlling circuit 904 emulates the states (i.e., blown or not blown) of the fuses h8-1 through h8-F in the condition storing unit 803 according to data signal DATA input from outside the circuit, thereby outputting control signals CTa-1 to CTa-Q and CTb-1 to CTb-Q. For example, in the case of data signal DATA for emulating a state in which the fuses h8-1 and h8-2 are blown, F voltage levels shown by this data signal DATA are “L, L, H, . . . , H”. In this case, the condition controlling circuit 904 sets control signals CTa-1 to CTa-3 at the H level, control signals CTa-4 to CTa-Q at the L level, control signals CTb-1 to CTb-3 at the L level, and control signals CTb-4 to CTb-Q at the H level.

<Operation>

Now, operation of the gate voltage adjusting section 900 illustrated in FIG. 9 will be described.

[Condition-Fixed Mode]

When receiving control signal CONT which requires switching to the condition-fixed mode, the condition controlling circuit 904 enters a condition-fixed mode. Then, the condition controlling circuit 904 connects one terminal of each of the fuses h8-1 through h8-F included in the condition storing unit 803 to the condition controlling circuit 904 itself, and reads binary data represented by the states (i.e., blown or not blown) of the fuses. Thereafter, the condition controlling circuit 904 decodes the binary data that has been read out and outputs control signals CTa-1 to CTa-Q and CTb-1 to CTb-Q to the gates of the corresponding selection transistors Sa901-1 to Sa901-Q and Sb901-1 to Sb901-Q.

When the fuse h8-1 is blown, the condition controlling circuit 904 sets control signals CTb-1 and CTa-2 to CTa-Q at the L level (active) and the other control signals CTa-1 and CTb-2 to CTb-Q at the H level (inactive). Accordingly, the selection transistor Sa901-1 is not activated and the selection transistor Sb901-1 is activated, so that the gate and drain of the current-voltage converting transistor T702-1 have the same potential and a current flows through the current-voltage converting transistor T702-1. On the other hand, the selection transistors Sa901-2 to Sa900-Q are activated and the selection transistors Sb901-2 to Sb901-Q are not activated, so that the gates of the current-voltage converting transistors T702-2 to T702-Q have the same potential as the internal power supply nodes Vdd and no current flows through the current-voltage converting transistors T702-2 to T702-Q. That is, reference current Iref flows only in the current-voltage converting transistor T702-1. In this manner, gate voltage Vid generated at the gate of the current-voltage converting transistor T702-1 is input to the gates of the supply reference transistors T101RA and T101RB.

In this manner, the output states of control signals CTa-1 to CTa-Q and CTb-1 to CTb-Q stored in the condition storing unit 803 are reproduced. In addition, these output states are maintained.

[Emulation Mode]

When receiving a control signal CONT which requires switching to the emulation mode, the condition controlling circuit 904 enters an emulation mode. Then, the condition controlling circuit 904 outputs control signals CTa-1 to CTa-Q and CTb-1 to CTb-Q according to data signal DATA.

In this case, when data signal DATA for emulating a state in which the fuse h8-2 is blown is input to the condition controlling circuit 904, the condition controlling circuit 904 sets control signals CTb-1, CTb-2 and CTa-3 to CTa-Q at the L level (active) and control signals CTa-1, CTa-2 and CTb-3 to CTb-Q at the H level (inactive). Accordingly, the selection transistor Sa901-1 is not activated and the selection transistor Sb901-1 is activated, so that the gate and drain of the current-voltage converting transistor T701-1 have the same potential and a current flows through the current-voltage converting transistor T701-1. Since the selection transistor Sa901-2 is not activated and the selection transistor Sb901-2 is activated, the gate and drain of the current-voltage converting transistor T702-2 have the same potential and a current flows through the current-voltage converting transistor T702-2. On the other hand, the selection transistors Sa901-3 to Sa901-Q are activated and the selection transistors Sb901-3 to Sb901-Q are not activated, so that the gates of the current-voltage converting transistors T702-3 to T702-Q have the same potential as the power supply node Vdd and no current flows through the current-voltage converting transistors T702-3 to T702-Q. That is, reference current Iref flows only in the current-voltage converting transistors T702-1 and T702-2. In this manner, gate voltage Vid generated at the gate of the current-voltage converting transistor T702-1 and gate voltage Vid generated at the gate of the current-voltage converting transistor T702-2 are input to the gates of the supply reference transistors T101RA and T101RB.

In this manner, the states (i.e., blown or not blown) of the fuses h8-1 to h8-F in the condition storing unit 803 are emulated according to data signal DATA, so that the voltage value of gate voltage Vid input to the supply reference transistors T101RA and T101RB is adjusted.

<Effects>

As described above, the performance of the current-voltage converting unit 901 is adjusted by the condition controlling circuit 904, so that the current driver is allowed to operate under conditions (optimum conditions) in which the states of output currents Iout in driving transistors T105-1 to T105-K are optimized.

In addition, in the case where the output states of control signals CTa-1 to CTa-Q and CTb-1 to CTb-Q are stored by blowing the fuses h8-1 to h8-F included in the condition storing unit 803 based on the emulation result, the conditions achieved when output currents Iout are in optimum states are maintained.

Embodiment 10

<General Structure>

Figure 10:
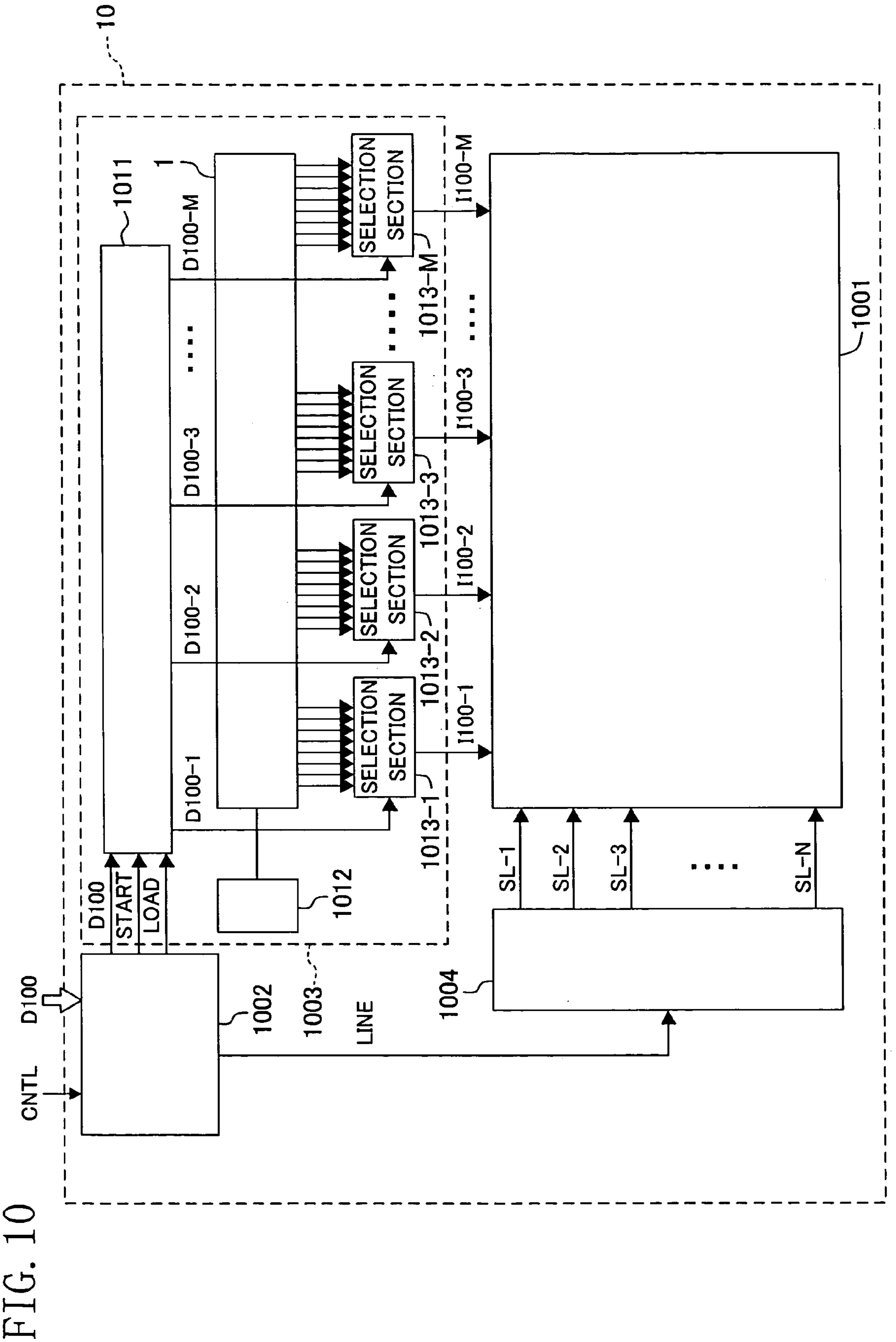
FIG. 10 shows a general structure of a display device according to embodiment 10 of the present invention.
Figure 11:
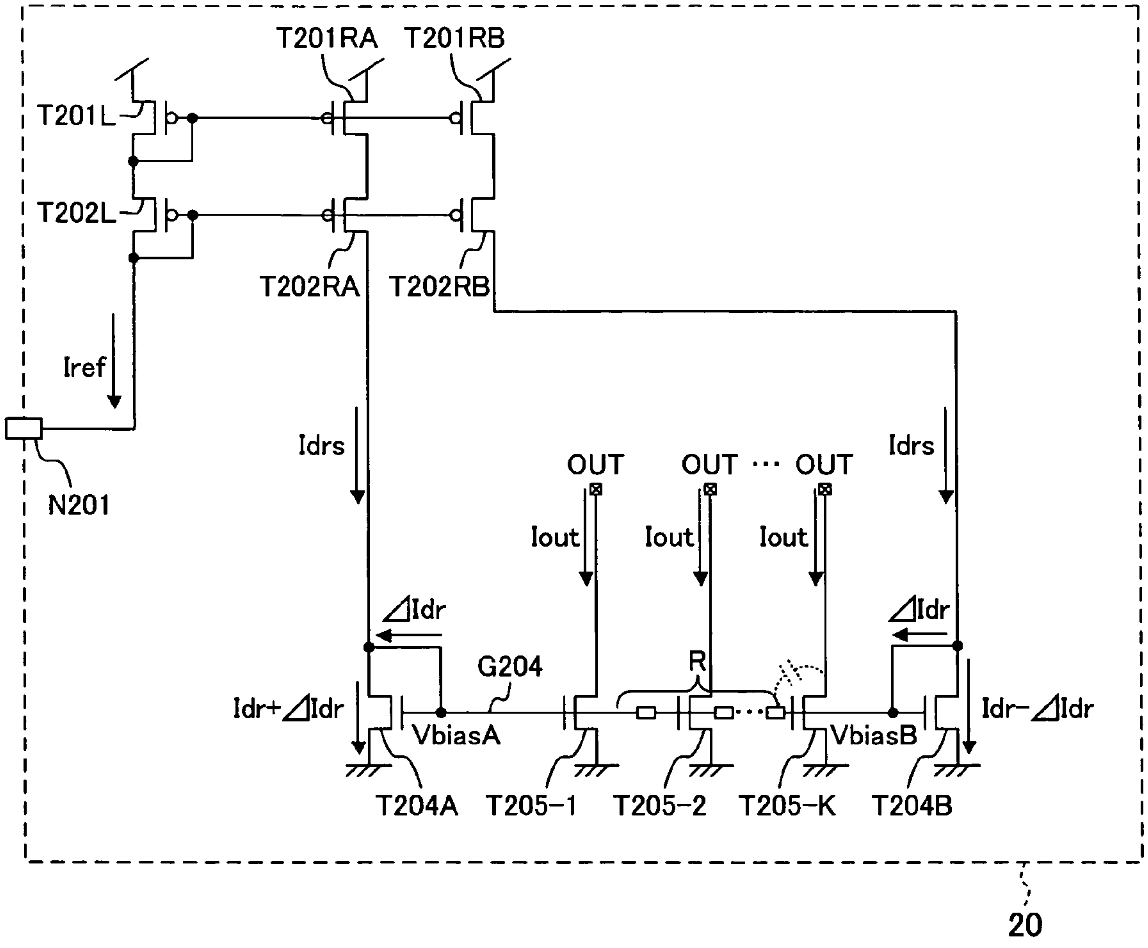
FIG. 11 shows a general structure of a conventional current driver.

FIG. 10 shows a general structure of a display device 10 according to embodiment 10 of the present invention. The display device 10 includes a display panel 1001, a control section 1002, a data driver 1003, and a gate driver 1004. The display device 10 displays externally-input representation data (herein, 3-bit data (=8 gray levels)) over the display panel 1001.

The display panel 1001 includes M×N organic EL elements (M and N are natural numbers), M data lines which extend in a vertical direction, and N gate lines which extend in a horizontal direction. Each of the organic EL elements is connected to a corresponding data line through a switching element. The gate of the switching element is connected to a corresponding gate line. That is, the display panel 1001 is a so-called "active matrix" panel. When one of the gate lines is activated, M switching elements connected to the gate line connect organic EL elements corresponding to the switching element (organic EL elements aligned in a horizontal direction) with the data line corresponding to the switching element.

When receiving externally-input representation data D100 and control information CTRL, the control section 1002 outputs representation data D100, start signal START, and load signal LOAD to the data driver 1003 and, meanwhile, outputs scan control signal LINE to the gate driver 1004. Representation data D100 includes representation data D100-1 to D100-M which represent the gray level for one pixel (herein, data for one horizontal line in the display panel 1001). Control information CTRL represent various information, such as the display timing, and the like. Start signal START indicates the timing at which the data driver 1003 holds representation data D100. Load signal LOAD indicates the timing at which the data driver 1003 generates driving currents I100-1 to I100-M.

The data driver 1003 outputs driving currents I100-1 to I100-M to the M data lines of the display panel 1001 according to representation data D100 output from the control section 1002 for driving the organic EL elements over the display panel 1001. The gate driver 1004 outputs scan signals SL-1 to SL-N (N is a natural number) to the N gate lines of the display panel 1001 according to scan control line LINE output from the control section 1002. It should be noted herein that the gate driver 1004 outputs scan signals SL-1 to SL-N to the N gate lines sequentially from the uppermost gate line (so-called, "line-sequential scanning" drive mode).

<Internal Structure of Data Driver 1003>

The data driver 1003 shown in FIG. 10 includes a data latch section 1011, a reference current supply 1012, the current driver 1 of FIG. 1, and M selection sections 1013-1 to 1013-M.

The data latch section 1011 holds representation data D100 output from the control section 1002 in the form of representation data D100-1 to D100-M, each of which corresponds to one pixel, according to start signal START output from the control section 1002. The data latch section 1011 outputs held representation data D100-1 to D100-M to the selection sections 1013-1 to 1013-M according to load signal LOAD output from the control section 1002.

The reference current supply 1012 supplies reference current Iref to the current driver 1.

The current driver 1 outputs a plurality of output currents Iout to the selection sections 1013-1 to 1013-M using reference current Iref supplied by the reference current supply 1012 (herein, it is assumed that the current driver 1 includes 8×M driving transistors for outputting 8 output currents Iout to each of the selection sections 1013-1 to 1013-M).

The selection sections 1013-1 to 1013-M each select, among 8 output currents Iout output from the current driver 1, a number of output currents Iout which is determined according to representation data D100-1 to D100-M output from the data latch section 1011. The selection sections 1013-1 to 1013-M correspond to the M data lines of the display panel 1001 on a one-to-one basis. The selection sections 1013-1 to 1013-M output the totals of all selected output currents Iout as driving currents I100-1 to I100-M to the data lines corresponding to the selection sections 1013-1 to 1013-M.

<Operation>

Next, the operation flow of the display device 10 shown in FIG. 10 is described from the step of outputting output currents Iout by the current driver 1 to the step of driving the organic EL elements.

First, the current driver 1 outputs 8 output currents Iout to each of the selection sections 1013-1 to 1013-M.

The selection sections 1013-1 to 1013-M each select, among 8 output currents Iout output from the current driver 1, a number of output currents Iout which is determined according to representation data D100-1 to D100-M output from the data latch section 1011. For example, when representation data D100-1 indicates "gray level=7", the selection section 1013-1 selects 7 out of 8 output currents Iout. In this case, where the current value of one output current Iout is "Ia", the current value of driving current I100-1 output from the selection section 1013-1 is "7×Ia". Therefore, driving current 1100-1 which has a current value of "7×Ia" is input to the data line corresponding to the selection section 1013-1. The selection sections 1013-2 to 1013-M operate in the same way such that the M data lines receive driving currents I100-2 to I100-M from the corresponding selection sections 1013-2 to 1013-M.

Meanwhile, the gate driver 1004 outputs scan signals SL-1 to SL-N according to scan control signal LINE output from the control section 1002. Herein, when the gate driver 1004 outputs scan signal SL-1 to the gate line of the uppermost row of the display panel 1001, M switching elements connected to the gate line of the uppermost row are activated, whereby M organic EL elements of the uppermost row of the display panel 1001 are connected to corresponding data lines to receive driving currents I100-1 to I100-M flowing through the corresponding data lines.

Then, the M organic EL elements at the uppermost row of the display panel 1001 emit light according to the current values of driving currents I100-1 to I100-M. Since driving currents I100-1 to I100-M has current values which are determined according to the gray levels represented by representation data D100-1 to D100-M, respectively, the brightness of each of the M organic EL elements is determined according to the gray level represented by a corresponding one of representation data D100-1 to D100-M. Therefore, representation data D100 for one horizontal line is displayed-in the horizontal line at the uppermost row.

The above-described process is performed on all the horizontal lines in this way, whereby representation data of 3 bits (=8 gray levels) is displayed over the display panel 1001.

<Effects>

As described above, the current driver 1 outputs output currents Iout having the same current value. The selection sections 1013-1 to 1013-M are capable of generating driving currents I100-1 to I100-M which have current values determined according to the gray levels represented by representation data D100-1 to D100-M with high accuracy. Thus, the variation in emission of the light emitting elements over the display panel 1001 is decreased.

Although in this embodiment the current driver 1 of embodiment 1 is used, any of the current drivers of embodiments 2 to 5, 7 and 8 (FIGS. 2 to 5, 7A, 7B, 8 and 9) may be used instead. In the case where the current driver 6 of embodiment 6 (FIG. 6) is used, the selection sections 1013-1 to 1013-M are appropriately associated with the inverter circuits 606-1 to 606-K of FIG. 6 such that each of the selection sections 1013-1 to 1013-M outputs a control signal indicative of ON or OFF to an inverter circuit (or a plurality of inverter circuits) corresponding to the selection section according to a corresponding one of representation data D100-1 to D100-M.

Although this embodiment has a structure where one horizontal line of the display panel 1001 has M pixels and one organic EL element is provided to each pixel, an alternative structure is possible wherein three organic EL elements (an organic EL element for R-component, an organic EL element for G-component, and an organic EL element for B-component) are provided for one pixel. In this case, representation data D100 includes M×3 pieces of representation data D100-1 to D100-(M×3). The data driver 1003 includes three current drivers and M×3 selection sections 1013-1 to 1013-(M×3). The three current drivers output output currents Iout which have current values suitable for R-, G- and B-components. Among the selection sections 1013-1 to 1013-(M×3), the selection section 1013-(3X-2) (X is a natural number satisfying $1 \leqq X \leqq M$) receives output current Iout from the current driver corresponding to R-component, the selection section 1013-(3X-1) receives output current Iout from the current driver corresponding to G-component, and the selection section 1013-(3X) receives output current Iout from the current driver corresponding to B-component. The data latch section 1011 outputs representation data D100-(3X-2) corresponding to R-component to the selection section 1013-(3X-2), representation data D100-(3X-1) corresponding to G-component to the selection section 1013-(3X-1), and representation data D100-(3X) corresponding to B-component to the selection section 1013-(3X). With this structure, the organic EL element corresponding to R-component, the organic EL element corresponding to G-component, and the organic EL element corresponding to B-component have the brightness determined according to representation data D100-(3X-2) corresponding to R-component, the brightness determined according to representation data D100-(3X-1) corresponding to G-component, and the brightness determined according to representation data D100-(3X) corresponding to B-component, respectively. In this way, the current values of output currents Iout output from the current drivers separately provided for R-, G- and B-components are adjusted, whereby the brightness of the organic EL elements separately provided for R-, G- and B-components is separately adjusted. Therefore, the brightness of each pixel is adjusted with high accuracy.

A current driver according to the present invention is useful as a current driving type display driver of an organic EL panel, or the like. The current driver of the present invention is also applicable to uses of a printer driver, and the like, which includes a plurality of circuit blocks to supply output currents with high accuracy based on combination of current values among the circuit blocks.

What is claimed is:

1. A current driver, comprising:

a first input/output section through which a first current is input or output;

a first bias voltage generating transistor connected between the first input/output section and a first reference node;

a second input/output section through which a second current is input or output;

a second bias voltage generating transistor connected between the second input/output section and the first reference node;

K driving transistors connected between an output node through which an output current is input or output and the first reference node, where K is a natural number;

a first gate line to which a gate of the first bias voltage generating transistor, gates of the K driving transistors, and a gate of the second bias voltage generating transistor are connected in this order;

a first voltage supply node which receives a first voltage;

a first differential amplifier circuit which outputs a third voltage having a voltage value determined according to a difference between a voltage value of a second voltage at a first interconnection node of the first input/output section and the first bias voltage generating transistor and the first voltage value of the first voltage received by the first voltage supply node;

a second voltage supply node which receives a fourth voltage; and a second differential amplifier circuit which outputs a sixth voltage having a voltage value determined according to a difference between a voltage value of a fifth voltage at a second interconnection node of the second input/output section and the second bias voltage generating transistor and the fourth voltage value of the fourth voltage received by the second voltage supply node, wherein the first bias voltage generating transistor receives at its gate the third voltage output by the first differential amplifier circuit, and the second bias voltage generating transistor receives at its gate the sixth voltage output by the second differential amplifier circuit.

2. A data driver, comprising:

the current driver of claim 1;

a selection section for selecting X output currents according to externally-input representation data from among K output currents output by the current driver, where X is a natural number satisfying X≦K; and a driving current output terminal from which a total of the X output currents selected by the selection section is output as a driving current, wherein the representation data represents a gray level.

3. A display device, comprising:

the data driver of claim 2; and a display panel which is driven by a driving current output from the data driver.

4. The current driver of claim 1, further comprising:

a third input/output section through which a third current is input or output;

a third bias voltage generating transistor connected between the third input/output section and the first reference node;

a third voltage supply node which receives a seventh voltage; and a third differential amplifier circuit which outputs a ninth voltage having a voltage value determined according to a difference between a voltage value of an eighth voltage at a third interconnection node of the third input/output section and the third bias voltage generating transistor and the seventh voltage value of the seventh voltage received by the third voltage supply node, wherein the gate of the first bias voltage generating transistor, gates of first to Hth of the driving transistors, a gate of the third bias voltage generating transistor, gates of (H+1)th to Kth of the driving transistors, and a gate of the second bias voltage generating transistor are connected to the first gate line in this order, where H is a natural number satisfying 1≦H≦K-1, and the third bias voltage generating transistor receives at its gate the ninth voltage output by the third differential amplifier circuit.

5. The current driver of claim 1, further comprising:

K output voltage limiting transistors connected between the K driving transistors and the output node; and a second gate line to which gates of the K output voltage limiting transistors are connected, wherein the second gate line receives a limited voltage which has a predetermined voltage value.

6. The current driver of claim 5, further comprising:

a first voltage limiting transistor connected between the first interconnection node and the first bias voltage generating transistor; and a second voltage limiting transistor connected between the second interconnection node and the second bias voltage generating transistor, wherein a gate of the first voltage limiting transistor, the gates of the K output voltage limiting transistors, and a gate of the second voltage limiting transistor are connected to the second gate line in this order.

7. The current driver of claim 6, further comprising:

a third input/output section through which a third current is input or output; and first and second cascode transistors connected in series between the third input/output section and the first reference node, wherein the first cascode transistor is connected between the third input/output section and the second cascode transistor, a gate and drain of the first cascode transistor being connected to each other, the second cascode transistor is connected between the first cascode transistor and the first reference node, a gate and drain of the second cascode transistor being connected to each other, and the second gate line receives a first gate voltage generated at the gate of the first cascode transistor.

8. The current driver of claim 7, wherein the first and second voltage supply nodes receive the first gate voltage generated at the gate of the first cascode transistor.

9. The current driver of claim 5, further comprising a voltage follower circuit, wherein the second gate line receives an output of the voltage follower circuit.

10. The current driver of claim 9, further comprising:

a first voltage limiting transistor connected between the first interconnection node and the first bias voltage generating transistor;

a third input/output section through which a third current is input or output; and first and second cascode transistors connected in series between the third input/output section and the first reference node, wherein the first cascode transistor is connected between the third input/output section and the second cascode transistor, a gate and drain of the first cascode transistor being connected to each other, the second cascode transistor is connected between the first cascode transistor and the first reference node, a gate and drain of the second cascode transistor being connected to each other, and the gate of the first voltage limiting transistor and the voltage follower circuit receive a first gate voltage generated at the gate of the first cascode transistor.

11. The current driver of claim 10, further comprising:

a second voltage limiting transistor connected between the second interconnection node and the second bias voltage generating transistor;

a fourth input/output section through which a fourth current is input or output; and third and fourth cascode transistors connected in series between the fourth input/output section and the first reference node, and wherein the third cascode transistor is connected between the fourth input/output section and the fourth cascode transistor, a gate and drain of the third cascode transistor are connected to each other, the fourth cascode transistor is connected between the third cascode transistor and the first reference node, a gate and drain of the fourth cascode transistor are connected to each other, and the second voltage limiting transistor receives at its gate a second gate voltage generated at the gate of the third cascode transistor.

12. The current driver of claim 11, wherein:

the first voltage supply node receives the first gate voltage generated at the gate of the first cascode transistor; and the second voltage supply node receives the second gate voltage generated at the gate of the third cascode transistor.

13. The current driver of claim 1, further comprising:

K switch transistors connected between the K driving transistors and the output node;

K control sections corresponding to the K switch transistors on a one-to-one basis; and a second gate line which receives a limited voltage having a predetermined voltage value, wherein each of the K control sections has a first mode and a second mode and includes a first terminal connected to the second gate line and a second terminal connected to the first reference node, in the first mode, a voltage at the first terminal is supplied to a gate of a switch transistor corresponding to the control section; and in the second mode, a voltage at the second terminal is supplied to a gate of a switch transistor corresponding to the control section.

14. The current driver of claim 1, further comprising a setting transistor connected between a second reference node and an input/output node through which a reference current is input or output, a gate and drain of the setting transistor being connected to each other, wherein:

the first input/output section includes a first supply transistor connected between the second reference node and the first interconnection node, a gate of the first supply transistor being connected to the gate of the setting transistor; and the second input/output section includes a second supply transistor connected between the second reference node and the second interconnection node, a gate of the second supply transistor being connected to the gate of the setting transistor.

15. The current driver of claim 14, wherein:

the first supply transistor is formed by P current-voltage conversion transistors, where P is a natural number;

the P current-voltage conversion transistors are connected in parallel between the second reference node and the first interconnection node; and each of the P current-voltage conversion transistors receives at its gate a gate voltage generated at the gate of the setting transistor.

16. The current driver of claim 15, further comprising:

a control section which selects N current-voltage conversion transistors from among the P current-voltage conversion transistors, where N is a natural number satisfying $N \leqq P$; and a connection section for connecting each of the N current-voltage conversion transistors selected by the control section to the first interconnection node.

17. The current driver of claim 16, further comprising a storage section for storing information indicative of the number of transistors which are to be selected by the control section from among the P current-voltage conversion transistors, wherein the control section selects N current-voltage conversion transistors from among the P current-voltage conversion transistors according to the information stored in the storage section.

18. The current driver of claim 17, wherein:

the storage section includes a plurality of fuses;

the control section has a condition-fixed mode and an emulation mode;

when the control section operates in the condition-fixed mode, the control section selects the N current-voltage conversion transistors according to the states of the plurality of fuses from among the-P current-voltage conversion transistors; and when the control section operates in the emulation mode, the control section emulates the states of the plurality of fuses to select the N current-voltage conversion transistors from among the P current-voltage conversion transistors.

19. The current driver of claim 14, wherein:

the setting transistor is formed by P current-voltage conversion transistors, where P is a natural number;

the P current-voltage conversion transistors are connected in parallel between the second reference node and the input/output node;

each of the P current-voltage conversion transistors has a gate and a drain connected to each other; and each of the first and second supply transistors receives, at its gate, gate voltages generated at the P current-voltage conversion transistors.

20. The current driver of claim 19, further comprising:

a control section which selects N current-voltage conversion transistors from among the P current-voltage conversion transistors, where N is a natural number satisfying N≦P; and a connection section for connecting a gate and a drain to each other in each of the N current-voltage conversion transistors selected by the control section, wherein each of the first and second supply transistors receives, at its gate, gate voltages generated at gates of the N current-voltage conversion transistors in which the gate and the drain are connected by the connection section.

21. The current driver of claim 20, further comprising a storage section for storing information indicative of the number of transistors which are to be selected by the control section from among the P current-voltage conversion transistors, wherein the control section selects N current-voltage conversion transistors from among the P current-voltage conversion transistors according to the information stored in the storage section.

22. The current driver of claim 21, wherein:

the storage section includes a plurality of fuses;

the control section has a condition-fixed mode and an emulation mode;

when the control section operates in the condition-fixed mode, the control section selects the N current-voltage conversion transistors from among the P current-voltage conversion transistors according to the states of the plurality of fuses; and when the control section operates in the emulation mode, the control section emulates the states of the plurality of fuses to select the N current-voltage conversion transistors from among the P current-voltage conversion transistors.

23. The current driver of claim 14, wherein the setting transistor and the first and second supply transistors are cascode-connected.

24. The current driver of claim 14 wherein:

each of the setting transistor, the first supply transistor, and the second supply transistor is formed by a plurality of transistors; and the plurality of transistors which form the setting transistor, the plurality of transistors which form the first supply transistor, and the plurality of transistors which form the second supply transistor are uniformly distributed over one chip.

* * * * *